United States Patent
Weber et al.

(10) Patent No.: US 9,112,053 B2
(45) Date of Patent: Aug. 18, 2015

(54) METHOD FOR PRODUCING A SEMICONDUCTOR DEVICE INCLUDING A DIELECTRIC LAYER

(75) Inventors: Hans Weber, Bayerisch Gmain (DE); Franz Hirler, Isen (DE); Andreas Meiser, Sauerlach (DE); Anton Mauder, Kolbermoor (DE); Kurt Sorschag, Villach-Landskron (AT); Stefan Gamerith, Villach (AT); Roman Knoefler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 218 days.

(21) Appl. No.: 13/537,374

(22) Filed: Jun. 29, 2012

(65) Prior Publication Data

US 2013/0005099 A1    Jan. 3, 2013

Related U.S. Application Data

(63) Continuation-in-part of application No. 13/173,872, filed on Jun. 30, 2011, now abandoned.

(51) Int. Cl.
| | | |
|---|---|---|
| *H01L 21/8234* | (2006.01) | |
| *H01L 27/06* | (2006.01) | |
| *H01L 29/40* | (2006.01) | |
| *H01L 29/66* | (2006.01) | |
| *H01L 29/78* | (2006.01) | |
| *H01L 29/06* | (2006.01) | |

(52) U.S. Cl.
CPC ... *H01L 21/823487* (2013.01); *H01L 21/823437* (2013.01); *H01L 21/823481* (2013.01); *H01L 27/0629* (2013.01); *H01L 29/0653* (2013.01); *H01L 29/407* (2013.01); *H01L 29/66734* (2013.01); *H01L 29/7802* (2013.01); *H01L 29/7828* (2013.01)

(58) Field of Classification Search
CPC ............ H01L 21/76224; H01L 21/76877; H01L 21/76831; H01L 21/76879; H01L 21/7688; H01L 21/7681; H01L 21/82285; H01L 29/7828; H01L 29/7802; H01L 29/0653; H01L 29/66712; H01L 29/1095; H01L 21/823437; H01L 21/823481; H01L 21/823487
USPC .......... 438/700, 445, 429, 361, 360, 337; 257/520
See application file for complete search history.

(56) References Cited

U.S. PATENT DOCUMENTS

| | | | | |
|---|---|---|---|---|
| 6,660,582 B2 * | 12/2003 | Birner et al. | ......... | 438/245 |
| 7,015,145 B2 * | 3/2006 | Jaiprakash et al. | ......... | 438/700 |
| 7,947,569 B2 * | 5/2011 | Mauder et al. | ......... | 438/429 |

(Continued)

*Primary Examiner* — Latanya N Crawford
(74) *Attorney, Agent, or Firm* — Murphy, Bilak & Homiller, PLLC

(57) ABSTRACT

A semiconductor device with a dielectric layer is produced by providing a semiconductor body with a first trench extending into the semiconductor body, the first trench having a bottom and a sidewall. A first dielectric layer is formed on the sidewall in a lower portion of the first trench and a first plug is formed in the lower portion of the first trench so as to cover the first dielectric layer. The first plug leaves an upper portion of the sidewall uncovered. A sacrificial layer is formed on the sidewall in the upper portion of the first trench and a second plug is formed in the upper portion of the first trench. The sacrificial layer is removed so as to form a second trench having sidewalls and a bottom. A second dielectric layer is formed in the second trench and extends to the first dielectric layer.

16 Claims, 16 Drawing Sheets

(56) References Cited

U.S. PATENT DOCUMENTS

| | | | |
|---|---|---|---|
| 2005/0186730 A1* | 8/2005 | Hsu | 438/243 |
| 2007/0108513 A1* | 5/2007 | Rub et al. | 257/329 |
| 2008/0102569 A1* | 5/2008 | Cheng et al. | 438/156 |
| 2008/0197441 A1* | 8/2008 | Mauder et al. | 257/487 |
| 2009/0322417 A1* | 12/2009 | Hirler et al. | 327/543 |
| 2011/0049618 A1* | 3/2011 | Lee et al. | 257/330 |
| 2013/0005101 A1* | 1/2013 | Weber et al. | 438/270 |

\* cited by examiner

A-A

METHOD FOR PRODUCING A SEMICONDUCTOR DEVICE INCLUDING A DIELECTRIC LAYER

TECHNICAL FIELD

Embodiments of the present invention relate to a method for producing a semiconductor device with a dielectric layer, in particular with a vertical and a buried horizontal dielectric layer.

BACKGROUND

In various integrated circuits a vertical dielectric layer is implemented. A "vertical dielectric layer" is a dielectric layer that extends in a vertical direction of a semiconductor body in which the circuit is integrated. The vertical dielectric layer may be used to dielectrically insulate different semiconductor devices of the circuit. In a new type of MOS transistor, a dielectric layer extends along a drift region of the MOS transistor and dielectrically insulates the drift region from a drift control region, where the drift control region serves to control a conducting channel in the drift region along the dielectric layer.

According to a known method, a vertical dielectric layer can be produced by forming a trench in the semiconductor body, forming the dielectric layer on at least one sidewall of trench and filling the trench with a monocrystalline semiconductor material. However, the dielectric layer may have a poor adhesion to the monocrystalline "filling material" and a huge number of oxide charges may be trapped along the interface between the dielectric layer and the semiconductor material. Thus, the dielectric layer may be removed using an etching technique and may be replaced by another dielectric layer formed by an oxidation step.

An etching technique, however, may be critical in those cases in which there is a horizontal dielectric layer arranged in the semiconductor body that adjoins the vertical dielectric layer. Etching the vertical layer would also partially etch the horizontal layer, which is undesirable.

There is, therefore, a need for an improved method for producing a semiconductor device including a dielectric layer, in particular a vertical dielectric layer.

SUMMARY

A first aspect relates to a method for producing a semiconductor device with a dielectric layer. The method includes providing a semiconductor body with a first trench extending into the semiconductor body layer, the first trench having a bottom and a sidewall, forming a first dielectric layer on the sidewall in a lower portion of the first trench, forming a first plug in the lower portion of the first trench so as to cover the second dielectric layer, the first plug leaving an upper portion of the sidewall uncovered, forming a sacrificial layer on the sidewall in the upper portion of the first trench, and forming a second semiconductor plug in the upper portion of the first trench. The method further includes removing the sacrificial layer, so as to form a second trench having sidewalls and a bottom, and forming a second dielectric layer in the second trench and extending to the first dielectric layer.

A second aspect relates to a method for producing a semiconductor device with a dielectric layer. The method includes providing a semiconductor body with a first trench extending from a first surface into the semiconductor body. The first trench has a bottom and a sidewall. The method further includes forming a protection layer on the sidewall, forming a sacrificial layer on the sidewall, and forming a semiconductor plug in the first trench. Further, a second trench is formed between the semiconductor body and the semiconductor plug, wherein forming the second trench at least includes removing the sacrificial layer, and a first dielectric layer is formed in the second trench.

A third aspect relates to a method for producing a semiconductor device with a dielectric layer. The method includes providing a semiconductor body with a first semiconductor layer, a second semiconductor layer and a dielectric layer between the first and second semiconductor layers and with a first trench extending from a first surface of the semiconductor body through the first semiconductor layer to the dielectric layer, the first trench having a bottom and a sidewall. The method further includes forming a sacrificial layer on the sidewall, extending the first trench to extend through the dielectric layer to the second semiconductor layer, forming a semiconductor plug in the extended first trench, forming a second trench between the semiconductor body and the semiconductor plug, wherein forming the second trench at least comprises at least partially removing the sacrificial layer, and forming a first dielectric layer in the second trench.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 which includes

FIG. 4 which includes

FIG. 5 which includes

FIG. 6 which includes

FIG. 7 which includes

FIG. 8 which includes

FIG. 9 which includes

FIG. 10 which includes

FIG. 11 which includes

FIG. 12 which includes

FIG. 13 which includes

FIG. 14 which includes

FIG. 15 which includes

FIG. 16 which includes

DETAILED DESCRIPTION

FIGS. 1A to 1G schematically illustrate a first example of a method for producing a semiconductor device that includes a vertical dielectric layer. FIGS. 1A to 1H each show a vertical cross sectional view of a semiconductor body 100 in which the vertical dielectric layer is produced. It should be noted that in these Figures only a section of the semiconductor body 100 is illustrated.

Figure 1A:
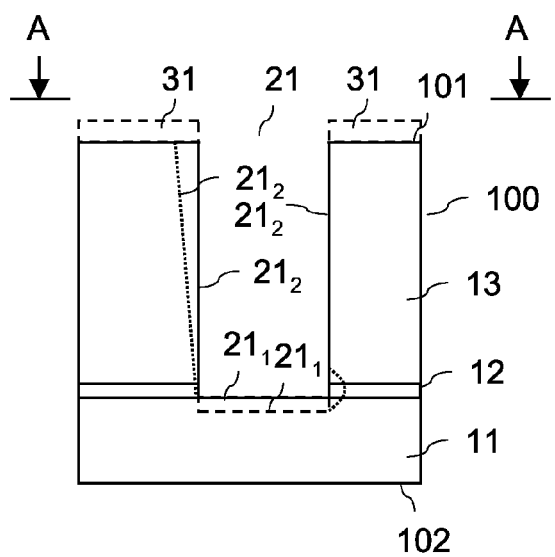
FIGS. 1A to 1G illustrates a first example of a method for producing a semiconductor device with a vertical dielectric layer.

Referring to FIG. 1A, the method includes providing a semiconductor body 100 with a first semiconductor layer 11, a second semiconductor layer 13 and a first dielectric layer 12 arranged between the first semiconductor layer 11 and the second semiconductor layer 13. The semiconductor body 100 further includes at least one first trench 21 that, from a first surface 101 of the semiconductor body 100, extends through the second semiconductor layer 13 and the first dielectric layer 12 to the first semiconductor layer 11.

The first trench 21 may extend just down to the first semiconductor layer 11 from the first surface 101, but may also extend into the first semiconductor layer (which is illustrated in dashed lines in FIG. 1A). The first trench 21 has a bottom $21_1$ formed by the first semiconductor layer 11, and has at least one sidewall $21_2$. The number of sidewalls $21_1$ of the trench 21 is dependent on the geometry of the trench.

Figure 2:
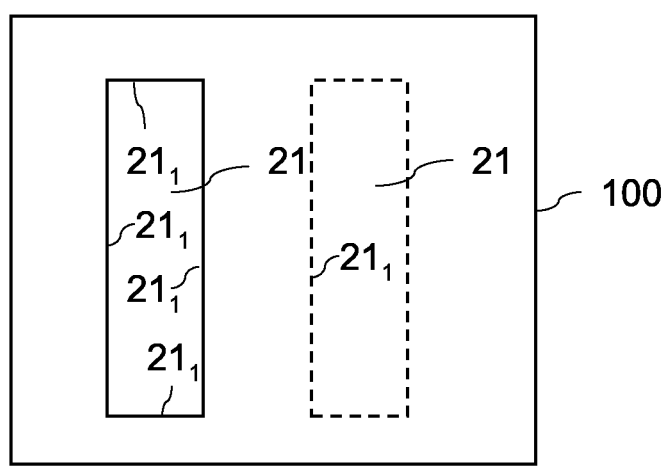
FIG. 2 illustrates a horizontal cross sectional view of a semiconductor body according to FIG. 1A according to a first example.
Figure 3:
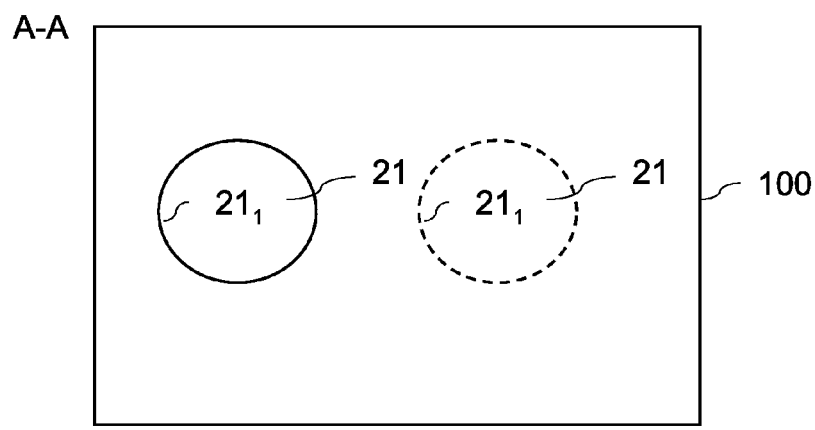
FIG. 3 illustrates a horizontal cross sectional view of a semiconductor body according to FIG. 1A according to a second example.

Referring to FIG. 2, which schematically illustrates a horizontal cross sectional view of the semiconductor body 100, the trench 21 may have a widely rectangular geometry. In this case, the trench 21 has four sidewalls $21_1$. According to a further example illustrated in FIG. 3, the trench 21 may have an elliptical or circular geometry. In this case the trench 21 has only one sidewall $21_1$. It should be noted, that forming the trench 21 with a rectangular or circular geometry is only an example. Any other trench geometry, such as a polygonal geometry, may be implemented as well.

In the following, the term "sidewall" denotes at least one sidewall of a trench. The processing of the sidewall which will be explained in the following can be applied to each sidewall of a trench with several sidewalls, but may also be applied to less sidewalls than the overall number of sidewalls.

According to one example, the first and second semiconductor layers 11, 13 are monocrystalline semiconductor layers. The first dielectric layer 12 includes or is comprised of an oxide, a nitride, a high-k-dielectric, or a composite structure with two or more different dielectric layers.

The semiconductor body 100 according to FIG. 1A is, for example, obtained by providing a semiconductor body with the first and second semiconductor layers 11, 13 and the first dielectric layer 12, and by etching a trench from a first surface 101 through the second semiconductor layer 13 and the first dielectric layer 12 down to or down into the first semiconductor layer 11. Etching the first trench 21 may include using an etch mask 31 applied to the first surface 101. This etch mask 31 is illustrated in dashed lines in FIG. 1A. The etch mask 31 is, for example, a hard mask, in particular an oxide hard mask. The method for etching the first trench 21 may involve two etching steps, a first etching step that etches the second semiconductor layer 13 down to the first dielectric layer 12, and a second etching step that etches through the dielectric layer 12 down to the first semiconductor layer 11. The etching process used for etching the dielectric layer may also slightly etch the semiconductor layers 11, 13, in particular, the first semiconductor layer 11. In this case, the trench 21 extends into the first semiconductor layer 11. According to one example, the etching steps are anisotropic etching steps.

According to a further example, the etching process for etching the second semiconductor layer 13 is an anisotropic process, while the etching process for etching the dielectric layer 12 is an isotropic process. This may result in a structure that is illustrated in dotted lines in the right section of the trench 21, in which the trench 21 widens in the region of the dielectric layer 15. The isotropic process for etching the dielectric layer 15 may also slightly etch the semiconductor layers 12, 13.

As will be apparent from the explanation below, the orientation of the trench sidewall $21_2$ defines the orientation of the dielectric layer to be produced in the semiconductor body 100. In the example illustrated in FIG. 1A, the trench sidewall $21_1$ extends in a vertical direction of the semiconductor body 100. The vertical direction is a direction perpendicular to the first surface 101 and a second surface 102. The second surface 102 is opposite to the first surface 101, where the first surface 101 is formed by the second semiconductor layer 13, and the second surface 102 is formed by the first semiconductor layer 11.

However, forming the trench 21 with a vertical sidewall $21_2$ is only an example. According to a further embodiment (illustrated in dotted lines), the trench 21 could also be produced with a beveled sidewall $21_2$. A bevel angle, which is an angle between the first surface 101 and the sidewall $21_2$ is, for example, in the range of between 60° and 120°, in particular between 80° and 100°. When the bevel angle is below 90°, the trench becomes wider in the direction of the bottom $21_1$, and when the bevel angle is above 90°, the trench becomes narrower in the direction of the bottom $21_1$.

Referring to FIG. 1A, the first dielectric layer 12 is uncovered at the sidewall $21_2$. Dependent on whether or not the trench 21 extends into the first semiconductor layer 11, the uncovered sections of the first dielectric layer 12 are arranged distant to the bottom $21_1$ of the trench 21 or adjoin the bottom $21_1$ of the trench 21.

The semiconductor body 100 with the first and second semiconductor layers 11, 13 and the first dielectric layer 12 can be implemented as an SOI substrate. The semiconductor layers 11, 13 may include any conventional semiconductor material, such as silicon (Si), silicon carbide (SiC), gallium arsenide (GaAs), or gallium nitride (GaN).

Figure 1B:
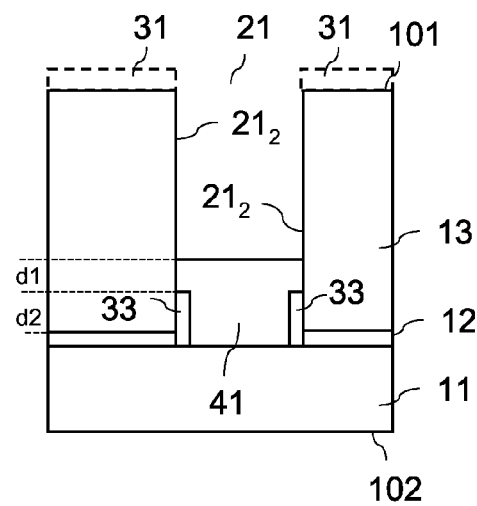

Referring to FIG. 1B, the method further includes forming a second dielectric layer 33 on the sidewalls $21_2$ in a lower portion of the trench 21 so that the second dielectric layer 33 covers the first dielectric layer 12 on the sidewall $21_2$. The second dielectric layer 33 can be a conventional dielectric layer, such as, for example, an oxide layer. An example of a method for producing the second dielectric layer 33 will be explained with reference to FIGS. 4A to 4D below.

Further, a first semiconductor plug 41 is formed in the lower portion of the first trench 21 so as to cover the second dielectric layer 33. The first semiconductor plug 41 includes, for example, a monocrystalline semiconductor material. The first semiconductor plug 41 leaves an upper portion of the sidewall 21$_2$ uncovered and covers the second dielectric layer 33 in a horizontal direction and in a vertical direction. A layer thickness d1 of the first semiconductor plug 41 above the second dielectric layer 33 in the direction of the first surface 101 is, for example, in the range between 5 nm and 100 nm, in particular between 20 nm and 50 nm. The second dielectric layer 33 completely covers the first dielectric layer 12 on the sidewall 21$_2$. The second dielectric layer 33 may overlap the second semiconductor layer 13 in the direction of the first surface 101. According to one example, the overlap d2 is, for example, in the range of between 20 nm and 2 μm.

Figure 1C:
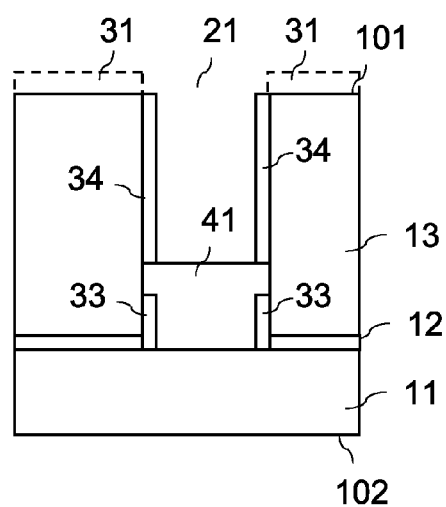

Referring to FIG. 1C, a sacrificial layer 34 is formed on the sidewall 21$_2$ of the trench 21 above the first semiconductor plug 41. According to one example, the sacrificial layer 34 extends from the first semiconductor plug 41 to the first surface 101 along the sidewall 21$_2$. The sacrificial layer 34 is, for example, a dielectric layer, such as an oxide layer. An oxide layer as the sacrificial layer 34 can be produced by performing an oxidation step that oxidizes the sidewall 21$_2$ and upper parts of the first semiconductor plug 41, wherein the oxide layer is then removed from the semiconductor plug 41. According to a further example, the sacrificial layer 34 is produced by depositing the sacrificial layer on the sidewall 21$_2$ and on the semiconductor plug 41, and by removing the sacrificial layer from the semiconductor plug 41.

Figure 1D:
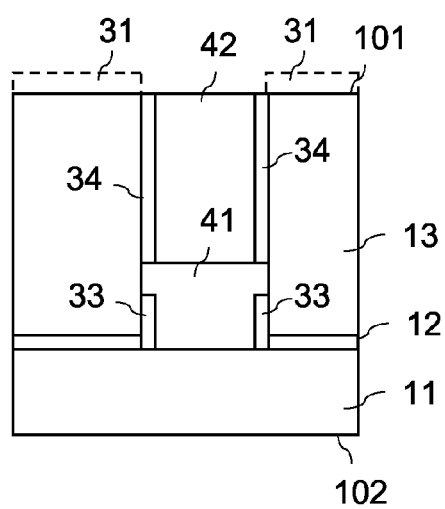

Referring to FIG. 1D, a second semiconductor plug 42 is formed on the first semiconductor plug 41. The second semiconductor plug 42 may completely fill the trench 21. According to one example, the second semiconductor plug 42 is produced using an epitaxial process, in particular a selective epitaxial process, in which a monocrystalline semiconductor material is grown on the first semiconductor plug 41. The first semiconductor plug may be formed by an epitaxial process that grows a semiconductor material on the bottom 21$_1$ of the trench. The two plugs 41, 42 may have identical or similar doping concentrations.

The etch mask 31 that can be used to etch the first trench 21 may remain on the first surface 101 throughout the method steps illustrated in FIGS. 1A to 1D.

Figure 1E:
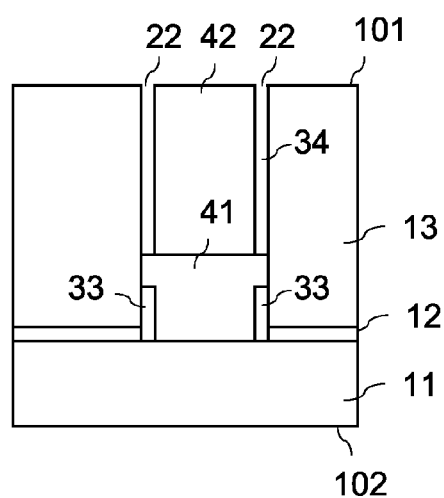

Referring to FIG. 1E, the sacrificial layer 34 is removed so as to form a second trench 22 between the second semiconductor layer 13 and the second semiconductor plug 42. The sacrificial layer 34 is, for example, removed by employing an etching process that etches the material of the sacrificial layer 34 selectively relative to the semiconductor material of the first semiconductor layer 13, of the second semiconductor plug 42. The first semiconductor plug 41 acts as an etch stop in the vertical direction and forms the bottom of the second trench 22.

Figure 1F:
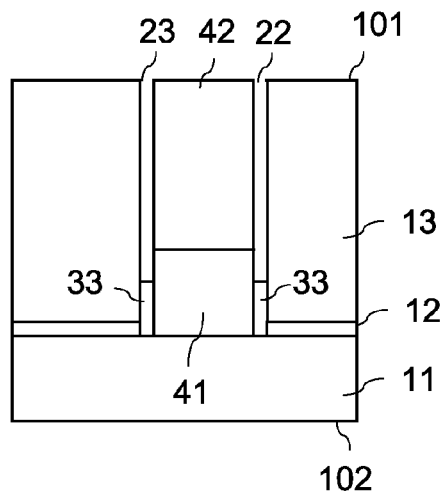

Referring to FIG. 1F, the second trench 22 is then extended down to the second dielectric layer 33 by removing those sections of the first semiconductor plug 41 arranged between the bottom of the second trench 22 and the second dielectric layer 33, so that a third trench 23 is formed that extends down to the second dielectric layer 33. Removing the first semiconductor plug 41 between the bottom of the second trench 22 and the second dielectric layer 33 includes, for example, an anisotropic etching process that anisotropically etches the semiconductor plug 41 down to the second dielectric layer 33. The third trench 23 does not extend down to the first dielectric layer which is covered by the second dielectric layer 33.

Figure 1G:
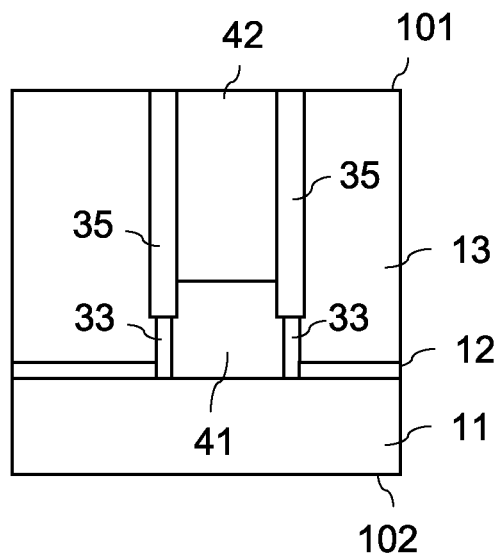

Referring to FIG. 1G a third dielectric layer 35 is produced in the third trench 23, where the third dielectric layer 35 adjoins the second dielectric layer 33, so that the second and third dielectric layer 33, 35 together form a composite vertical dielectric layer that extends from the first dielectric layer 12 to the first surface. Forming the third dielectric layer 35 includes, for example, an oxidation step in which sidewalls of the third trench 23 are oxidized. The third dielectric layer 35 is a high quality dielectric layer with good adhesion to the surrounding semiconductor material and with a reduced number of oxide charges trapped along the interface between the third dielectric layer 35 and the surrounding semiconductor material.

In the method illustrated in FIGS. 1E to 1G, producing the third dielectric layer 35 involves a two-step process which includes removing the semiconductor plug in a region between a bottom of the second trench 23 and the second dielectric layer 33, so as to form a third trench 23, and oxidizing sidewalls of the third trench 23. It should be noted that the third trench 23 does not have to extend down to the second dielectric layer 33; it is also possible to oxidize a part of the semiconductor plug 41 down to the second dielectric layer 33. In this case the oxidized section of the semiconductor plug 41 forms a part of the third dielectric layer 35. According to one embodiment, the semiconductor plug 41 between the bottom of the second trench 23 and the second dielectric layer 33 is not removed, but the semiconductor plug 41 is oxidized in the region below between a bottom of the second trench 23 and the second dielectric layer 33 and forms a first part of the third dielectric layer 35. A second part of the third dielectric layer is formed by oxidizing sidewalls of the second trench 22. The oxidation step that oxidizes the semiconductor plug 41 between the bottom of the second trench 22 and the first dielectric layer may be the same oxidation step that forms the third dielectric layer 35 in the second trench.

Figure 4A:
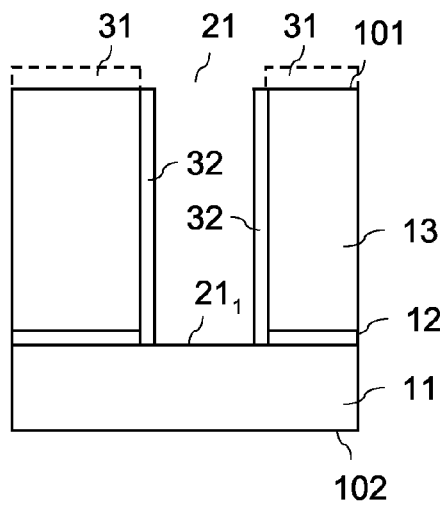
FIGS. 4A to 4D illustrates an example of a method for producing a dielectric layer on a sidewall in a lower portion of a trench.

An example of a method for producing the second dielectric layer 33 (see FIG. 1B) in the lower portion of the trench 21 will now be explained with reference to FIGS. 4A to 4D. Referring to FIG. 4A, a dielectric layer 32 is produced on the sidewall 21$_2$ so as to extend from the bottom 21$_1$ of the trench 21 to the first surface 101. Forming the dielectric layer 32 includes, for example, an oxidation step that oxidizes the bottom 21$_1$ and the sidewall 21$_2$ of the trench 21 or a deposition step in which a dielectric layer is deposited on the bottom 21$_1$ and the sidewall 21$_2$, and removing the dielectric layer from the bottom 21$_1$. Removing the dielectric layer from the bottom 21$_1$ may include an anisotropic etching process.

Figure 4B:
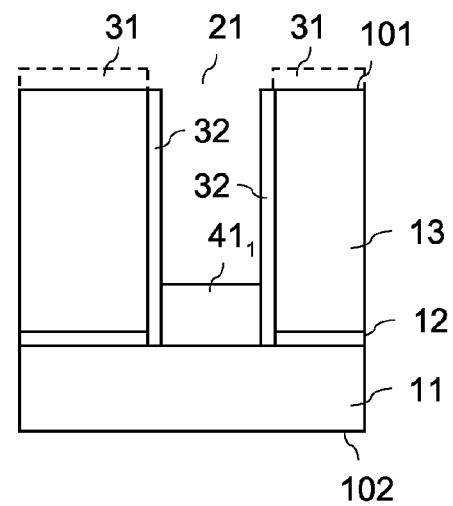
Figure 4C:
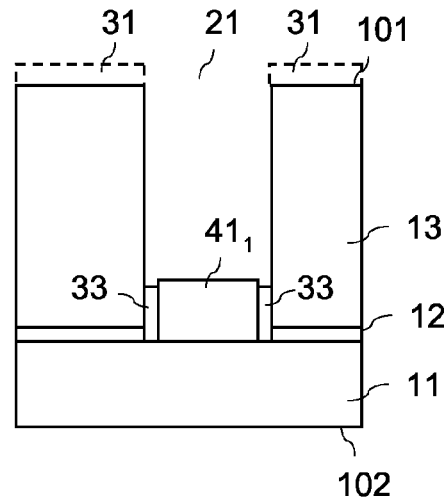
Figure 4D:
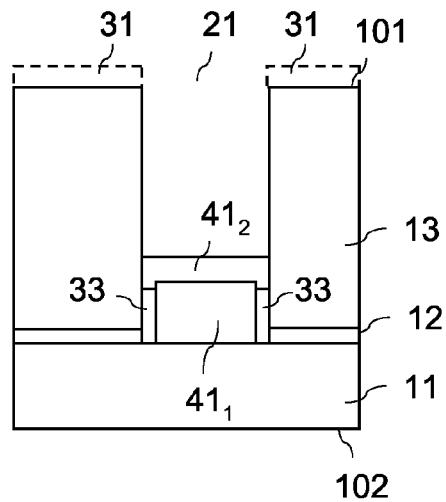

Referring to FIGS. 4B and 4C a mask or plug 41$_1$ is produced on the bottom 21$_1$ of the trench (see FIG. 4B), and those sections of the dielectric layer 32 that are not covered by the plug 41$_1$ are removed from the upper portion of the trench 21. Removing the dielectric layer 32 from the upper portion of the trench 21 may include an isotropic etching process that etches the dielectric layer 32 selectively relative to the semiconductor material of the second semiconductor layer 13 and to the material of the plug 41$_1$. That section of the dielectric layer 32 that is covered by the plug 41$_1$ and that remains after the etching process form the second dielectric layer 33. Referring to FIG. 4C, the dielectric layer 32 can be etched down to below an upper surface of the plug 41$_1$. A height of the plug 41$_1$, which is the vertical dimension of the plug 41$_1$, and the duration of the etching process are selected such that the second dielectric layer 33 has a desired height in the vertical direction. The second dielectric layer 33 covers the first dielectric layer 12 on the sidewall 21$_1$ of the trench. According to one embodiment, a height, which is the vertical dimension, of the second dielectric layer 33 is, in the range of between 0.1% and 20% of the depths of the trench 21. The "depth" of the trench is the vertical dimension of the trench 21.

In the example illustrated in FIGS. 4A to 4D, the plug $41_1$ forms a first section of the first semiconductor plug 41 (see FIG. 1C). In this case, the plug $41_1$ can be produced by employing an epitaxial process, in particular a selective epitaxial process in which the plug $41_1$ is epitaxially grown on the bottom $21_1$ of the trench 21. In this case, the semiconductor plug 41 is completed by growing or depositing a further layer $41_2$ on the semiconductor plug $41_1$. The further layer $41_2$ may be an epitaxially grown semiconductor layer or any other layer that may act as an etch stop in the etching process that etches the sacrificial 34 layer, such as, e.g., a nitride layer, an amorphous silicon layer, or a composite layer with, e.g., a carbon layer and a thin nitride or a thin silicon layer. The second layer $41_2$ covers the second dielectric layer 33 in the direction of the first surface 101. The second epitaxial layer $41_2$ adjoins a second semiconductor layer in a lateral or horizontal direction. A seam line may occur close to the second semiconductor layer 13 and extending in a vertical direction when the second plug $41_2$ is an epitaxial layer. However, this seam line or other crystal defects are in an area that is removed when forming the third trench 23 (see FIG. 1F).

According to a further example (not shown), the plug $41_1$ is removed after the method steps illustrated in FIG. 4C, and the first semiconductor plug 41 (see FIG. 1C) is grown on the bottom $21_1$ of the trench 21 after removing the spacer. In this case, the plug $41_1$ is not necessarily a monocrystalline semiconductor material, but can be any material against which the dielectric layer 32 can be selectively etched, such as, e.g., silicon nitride ($Si_3N_4$) or carbon (C).

It should be noted that the method explained before—like the method that will be explained below—is not restricted to produce a vertical dielectric layer in a semiconductor body that includes a buried horizontal dielectric layer, such as dielectric layer 12. The method could also be used to produce a vertical dielectric layer in a semiconductor body without horizontal dielectric layer.

A further example of a method for producing a semiconductor device with a vertical dielectric layer will be explained with reference to FIGS. 5A to 5E. Like the method explained before, this method includes providing a semiconductor body 100 with a first semiconductor layer 11, a second semiconductor layer 13 and a first dielectric layer 12 arranged between the first and second semiconductor layers 11, 13. The semiconductor body 100 further includes a trench 21 extending from a first surface 101 through the second semiconductor layer 13 and the first dielectric layer 12 to or into the first semiconductor layer 11. Everything which has been explained concerning the semiconductor layer 100 with reference to FIGS. 1A, 2 and 3 applies to the semiconductor body 100 illustrated in FIG. 5A accordingly.

Figure 5A:
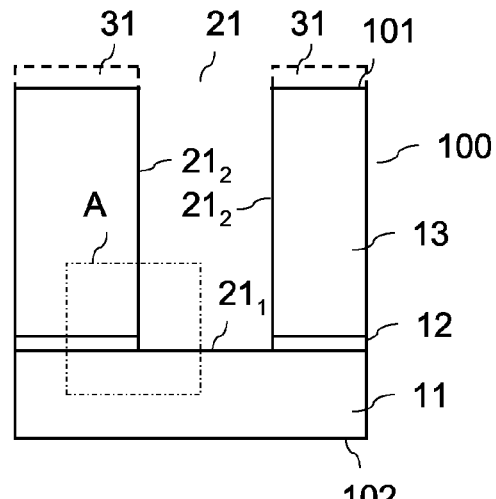
FIGS. 5A to 5E illustrates a further method for producing a semiconductor device with a vertical dielectric layer.

In the following, Figures that are additionally labeled with an "A" show a detail of the semiconductor body 100 in a section that is illustrated in dash-dotted lines in FIG. 5A. This section includes a part of the bottom $21_1$ and of the sidewall $21_2$ of the first trench 21 and of the first dielectric layer 12.

Figure 5B:
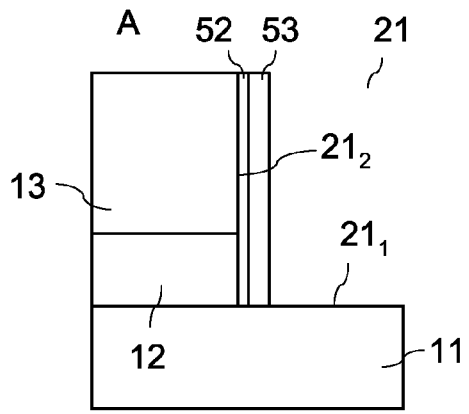

Referring to FIG. 5B a protection layer 52 and a sacrificial layer 53 are formed on the sidewall $21_2$, wherein the sacrificial layer 53 covers the protection layer 52. The protection layer 52 covers the first dielectric layer 12 on the sidewall $21_2$ and may extend from the bottom $21_1$ of the trench 21 to the first surface 101. In this case, the protection layer 52 is arranged between the second semiconductor layer 13 at the sidewall $21_2$. According to a further example explained below, the protection layer 52 covers the first dielectric layer 12, but does not extend to the first surface 101. In this case, the sacrificial layer 53 adjoins the second semiconductor layer 13 in sections of the sidewall $21_2$ in particular in upper sections of the sidewall $21_2$. According to one example, the sacrificial layer 53 extends to the first surface 101 of the semiconductor body 100.

Figure 5C:
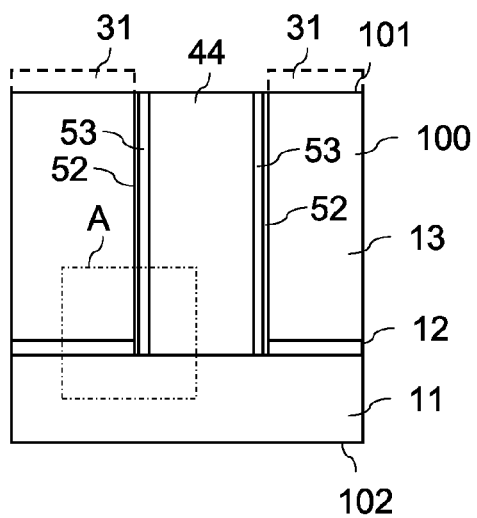
Figure 5D:
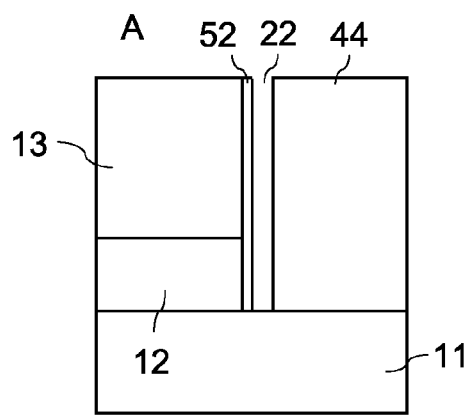

Referring to FIG. 5C, a semiconductor plug 44 is produced in the trench 21. According to one example, the semiconductor plug 44 completely fills the trench 21 and extends to the first surface 101. Referring to FIG. 5D a second trench is formed that extends from the first surface 101 into the semiconductor body 100. In the example illustrated in FIG. 5D, forming the second trench 22 only includes removing the sacrificial layer 53.

It should be noted that semiconductor plugs filling the trenches, such as plug 41, 42 in FIG. 1G and plug 44 in FIG. 5C, do not have to include the same material as the second semiconductor layer 13. The second semiconductor layer 13 may include a first semiconductor material, while the plug may include a second material. Further, the first semiconductor layer 11 can be different from the second layer 13 and/or the plugs 41, 42 (in FIG. 1G) 44 (in FIG. 5C) in terms of their semiconductor material. Suitable semiconductor materials for implementing the first and second semiconductor layers 11, 13 and the plug 41, 42; 44 are, e.g., silicon (Si) and silicon carbide (SiC). According to one embodiment, the first semiconductor layer 11 includes SiC, while at least one of the second semiconductor layer 13 and the plug includes Si.

Figure 5E:
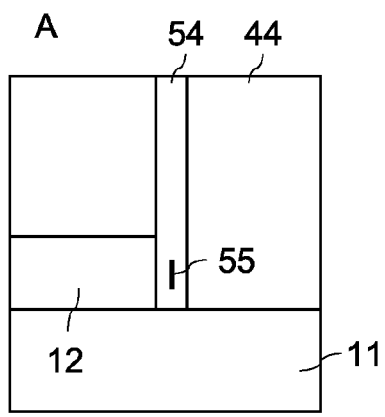

Referring to FIG. 5E a second dielectric layer 54 is formed in the second trench 22. Forming the second dielectric layer 54 includes an oxidation step that oxidizes at least the protection layer 52 and the semiconductor plug 44 along sidewalls of the second trench 22. Through the oxidation step, the protection layer 52 is "converted" into a part of the second dielectric layer. The protection layer 52 is, for example, a semiconductor layer, such as an amorphous or a polycrystalline semiconductor layer. The material of the semiconductor protection layer 52 may be identical to the material of the second semiconductor layer 13 and the semiconductor plug 44.

In the oxidation step that forms the second dielectric layer 54 also regions of the second semiconductor layer 13 can be oxidized. In those regions of the second trench 22 in which the protection layer 52 covers the first dielectric layer 12, only the protection layer 52 and the semiconductor plug 54 can be "consumed" to form the second dielectric layer 54, but there is no part of the second semiconductor layer 13 in this region that may be "consumed". Thus, a void 55 may be formed in the second dielectric layer 54 in the region of the first dielectric layer 12. The presence of such void 55 may, however, be tolerated in numerous applications in which the structure according to FIG. 5E with the horizontal first dielectric layer 12 and the vertical second dielectric layer 54 may be employed.

According to a further embodiment, forming the second trench 22 does not only include removing the sacrificial layer but also includes removing the protection layer. In this case, sidewalls of the second trench 22 are formed by the second semiconductor layer 13 and forming the second dielectric layer 54 includes oxidizing sidewalls of the second trench. Removing the protection layer 52 may include a process that removes the protection layer 52 selectively relative to the first dielectric layer 12.

An example of a method for forming the protection layer 52 and the sacrificial layer 53 will now be explained with reference to FIGS. 6A to 6D, in which schematically horizontal cross sectional views of detail "A" of the semiconductor body 100 are illustrated.

Figure 6A:
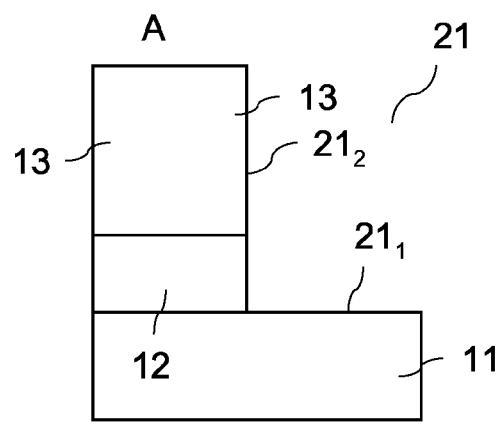
FIGS. 6A to 6D illustrates an example of a method for producing a protection layer and a sacrificial layer on a sidewall of a trench.
Figure 6B:
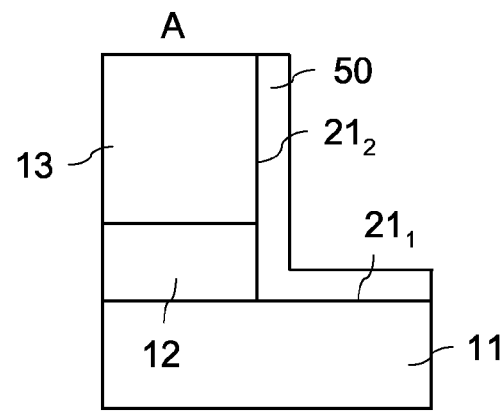
Figure 6C:
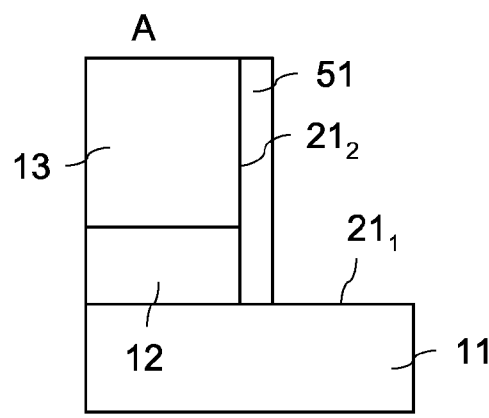

FIG. 6A shows the semiconductor body with the first and second semiconductor layers 11, 13, the first dielectric layer 12 and the first trench 21. Referring to FIG. 6C a protection and sacrificial layer 51 is formed on the sidewall $21_2$. Referring to FIG. 6B, forming the protection and sacrificial layer 51 may include forming a protection and sacrificial layer 50 on the bottom $21_1$ and the sidewall $21_2$ of the trench 21, and by removing the protection and sacrificial layer 50 from the bottom $21_1$. Removing the protection and sacrificial layer 50 from the bottom $21_1$ of the trench 21 may include an anisotropic etching process. The protection and sacrificial layer 51 is, for example, a semiconductor layer, such as an amorphous or polycrystalline semiconductor layer of the same material as the protection layer 52 (see FIG. 5D).

In the method explained with reference to FIGS. 6B to 6D, the oxidation step is performed after the protection and sacrificial layer 50 has been removed from the bottom $21_1$ of the trench. However, this is only an example. It is also possible to already perform the oxidation step after the protection and sacrificial layer 50 has been formed. In this case, the 52 protection layer and the sacrificial layer 53 are also formed on the bottom $21_1$ of the trench. The sacrificial layer 53 on the bottom $21_1$ of the trench is then removed using, e.g., an anisotropic etching process. The protection layer 51 on the bottom of the trench may also be removed. According to one embodiment, the protection and sacrificial layer 50 and, therefore, the protection layer 52 includes a monocrystalline semiconductor material of the same type as the first layer and/or plug 44. In this case, the protection layer 52 may remain on the bottom of the trench.

Figure 6D:
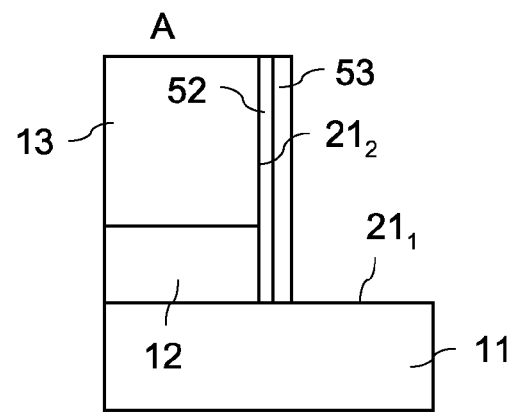

Referring to FIG. 6D surface regions of the protection and sacrificial layer 51 are converted into the sacrificial layer 53, while sections of the protection and sacrificial layer 51 which adjoin the first dielectric layer 12 and the second semiconductor layer 13 remain unchanged and form the protection layer 52. Forming the sacrificial layer 53 includes an oxidation process that oxidizes surface regions of the protection and sacrificial layer 51. This oxidation process may also oxidize sections of the first semiconductor layer 11 at the bottom $21_1$ of the trench. These oxidized bottom sections may then be removed using, for example, an anisotropic etching process before forming the plug 44 (see FIG. 5C).

According to a further example (not shown), first the protection layer 52 and then the sacrificial layer 53 are formed. The protection layer 52 is, e.g., a carbon layer, a polycrystalline semiconductor layer, such as a polysilicon layer, or an amorphous semiconductor layer, such as an amorphous silicon layer, while the sacrificial layer is, e.g., a deposited semiconductor-oxide layer (such as TEOS), a nitride layer, or a metal-oxide layer, such as an aluminum-oxide ($Al_2O_3$) layer.

Referring to the explanation provided above, the protection layer 52 may extend along the sidewall $21_2$ from the first dielectric layer 12 to the first surface 101 of the semiconductor body. However, this is only an example. Referring to further method steps illustrated in FIG. 7A to 7D the protection layer can be produced such that it basically covers the first dielectric layer 12 on the sidewall $21_1$, but does not extend to the first surface 101. In this case, the sacrificial layer 53 covers the protection layer but also covers (adjoins) sections of the sidewall $21_2$.

Figure 7A:
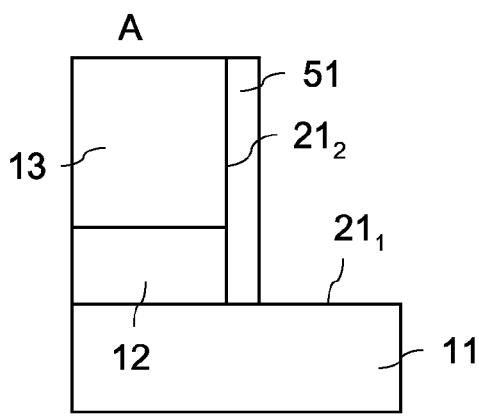
FIGS. 7A to 7E illustrates a first modification of the methods of FIGS. 4 and 5.
Figure 7B:
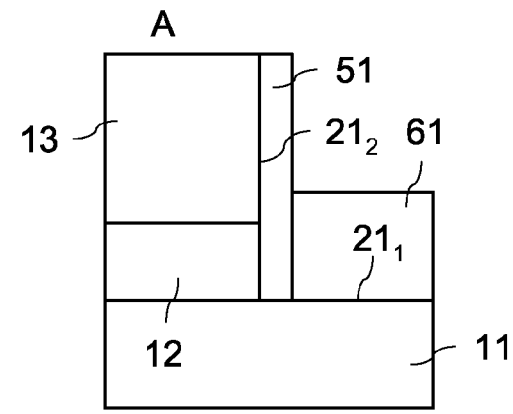
Figure 7C:
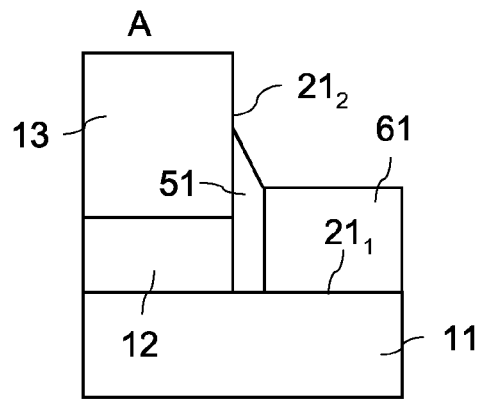
Figure 7D:
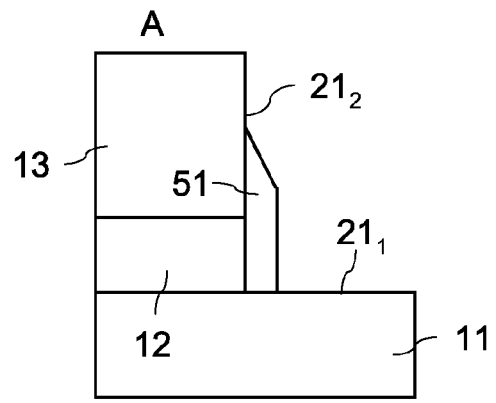

Referring to FIG. 7A, the protection and sacrificial layer 51 is formed on the sidewall $21_2$. The method steps that have been explained with reference to FIGS. 6B and 6C can be used to form the protection and sacrificial layer 21 on the sidewall $21_2$. Referring to FIGS. 7B to 7D the protection and sacrificial layer 51 is then removed from the sidewall $21_2$ in an upper portion of the trench. Removing the protection and sacrificial layer 21 may include producing a plug 61 on the bottom $21_1$ of the trench (see FIG. 7B), and etching the protection and sacrificial layer 51 on the sidewall $21_2$ in upper portions of the trench $21_2$, wherein those sections of the protection and sacrificial layer 51 covered by the plug 61 are protected from being etched (see FIG. 7C). Referring to FIG. 7D, the plug 61 is then removed. Removing the plug 61 may include an etching process that etches the material of the plug 61 selectively relative to the material of the protection and sacrificial layer 51 and the semiconductor material of the first and second semiconductor layers 11, 13. The plug includes, for example, a deposited oxide, such as a HDP (high density plasma) oxide, carbon, or a photo resist.

Figure 7E:
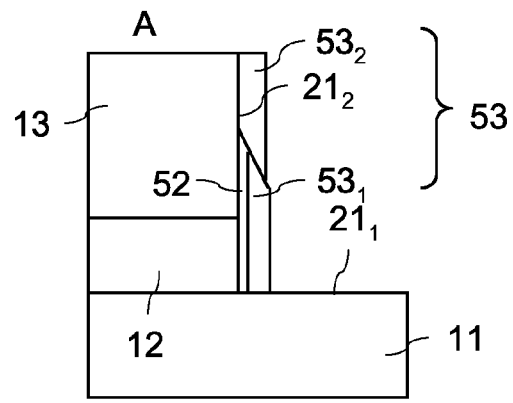

Referring to FIG. 7E, the protection layer 52 and the sacrificial layer 53 are formed. Forming the sacrificial layer 53 includes an oxidation step that partially oxidizes the protection and sacrificial layer 51 and that oxidizes surface regions of the second semiconductor layer 13 that are uncovered at the sidewall $21_1$. Thus, the sacrificial layer 53 includes two sections, a first section $53_1$ resulting from oxidizing the protection and sacrificial layer 51 (see FIG. 7D); and a second section resulting from oxidizing the second semiconductor layer 13 at the sidewall $21_2$. Like in the method explained with reference to FIGS. 6A to 6D it is also possible to first form the protection layer 52 and to the deposit the sacrificial layer on the protection layer 52.

The further method steps, which include forming the semiconductor plug 54, removing the sacrificial layer 53 and forming the second dielectric layer 54 correspond to the method steps illustrated with reference to FIGS. 5C to 5E.

Figure 8A:
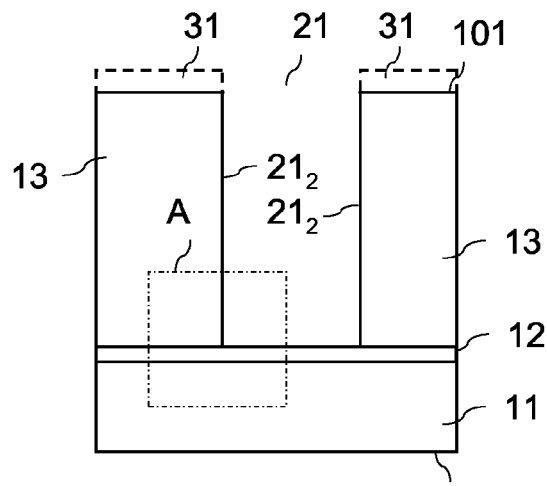
FIGS. 8A to 8E illustrates a second modification of the methods of FIGS. 4 and 5.
Figure 8B:
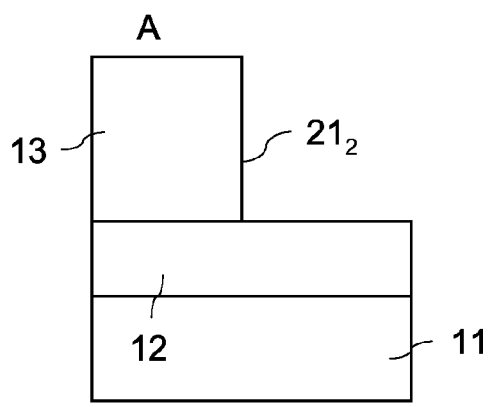
Figure 8C:
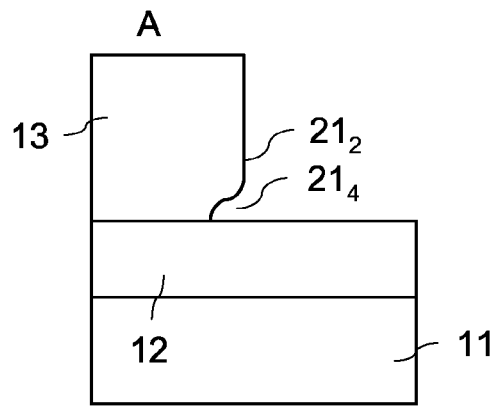

FIGS. 8A to 8E illustrate a modification of the methods explained with reference to FIGS. 5 to 7. Referring to FIGS. 8A and 8B, in this method, the first trench 21 is first produced to only extend to the first dielectric layer 12. Referring to FIG. 8C, an etching process is performed that etches the second semiconductor layer 13 at the bottom of the first trench 21 so as to remove material of the second semiconductor layer 13 in the region of the bottom of the first trench 21.

Figure 8D:
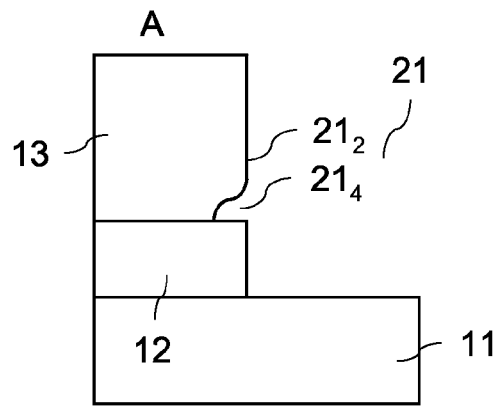
Figure 8E:
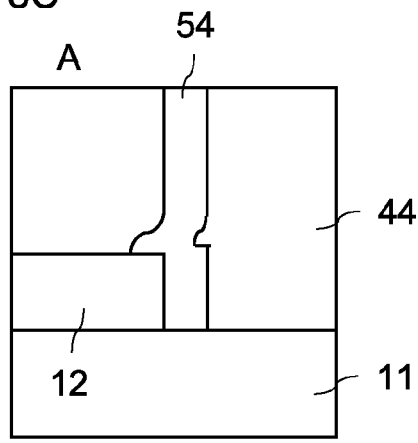

Referring to FIG. 8D, the first trench 21 is then etched down to the first semiconductor layer 11 or into the first semiconductor layer 11. Referring to FIG. 8E, the semiconductor plug 44 and the second dielectric layer 54 are then formed. Each of the methods explained before with reference to FIGS. 5 to 7 may be used to produce the semiconductor plug 44 and the second dielectric layer 54.

Figure 9A:
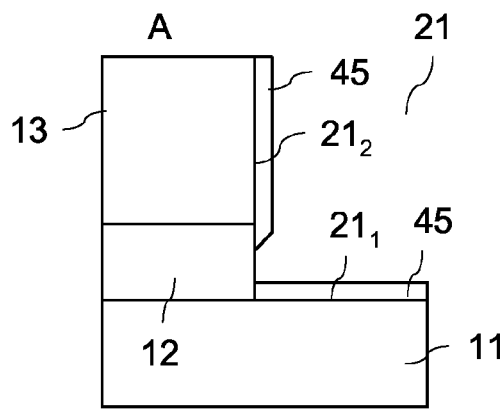
FIGS. 9A to 9B illustrates a third modification of the methods of FIGS. 4 and 5.
Figure 9B:
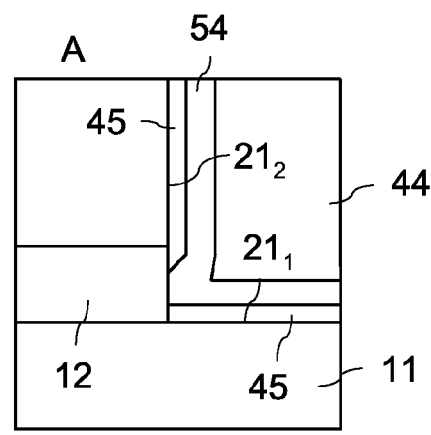

FIGS. 9A to 9B illustrate a further modification of the methods explained before with reference to FIGS. 5 to 7. Referring to FIG. 9A, in this method a semiconductor layer 45 is produced on the bottom $21_1$ and the sidewall $21_2$ such that the first dielectric layer 12 is at least partially uncovered at the sidewall $21_2$. The semiconductor layer 45 is, for example, formed by employing a selective epitaxial growth process. In this process semiconductor material grows on the first semiconductor layer 11, on the bottom $21_1$ of the trench 21, and on the second semiconductor layer 13 on the sidewall $21_2$ but does not grow on the first dielectric layer 12. Nevertheless, due to epitaxial overgrowth the semiconductor layer 45 may partially overlap the dielectric layer 12. After having produced the semiconductor layer 45, the semiconductor plug 44 and the second dielectric layer 54 are produced in correspondence with one of the methods explained with reference to FIGS. 5 to 7. The result is illustrated in FIG. 9B.

Figure 10A:
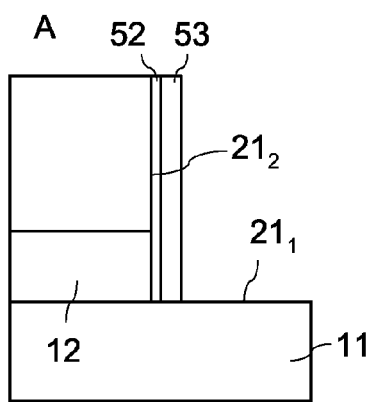
FIGS. 10A to 10G illustrates a fourth modification of the methods of FIGS. 4 and 5.
Figure 10B:
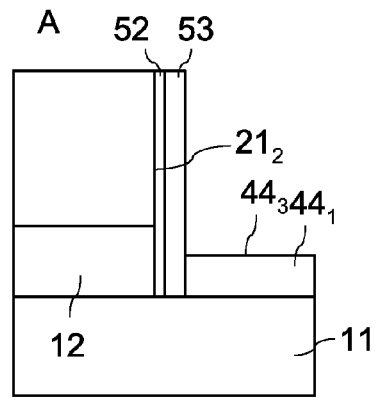
Figure 10C:
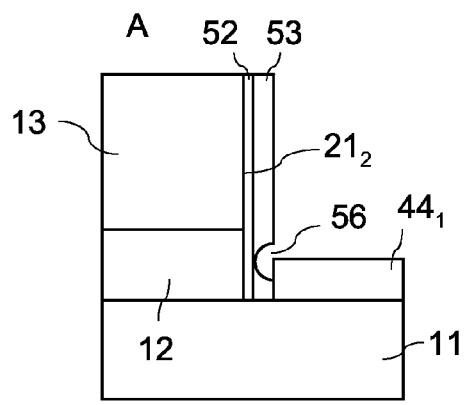
Figure 10D:
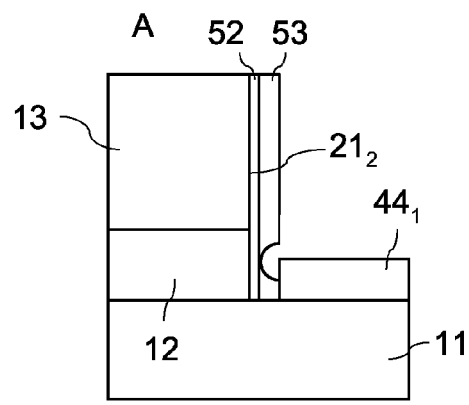

FIGS. 10A to 10G illustrate a further modification of the method according to FIGS. 5 to 7. In this method, after having formed the protection layer 52 and the sacrificial layer 53 on the sidewall 21₂ (see FIG. 10A), the sacrificial layer 53 is partially removed in the region of the first dielectric layer 12, as illustrated in FIG. 10C. Referring to FIG. 10B, partially removing the sacrificial layer 53 in the region of the first dielectric layer 12 includes forming a semiconductor layer 44₁ on the bottom 21₁. The semiconductor layer 44₁ can be produced by employing an selective epitaxial growth process. Using the semiconductor layer 44₁, the sacrificial layer 53 can be partially removed, so as to form a notch 56 in the sacrificial layer 53 in the region of a surface 44₃ of the semiconductor layer 44₁. Producing the notch 56 may include a temperature process in a hydrogen atmosphere. Assume that the semiconductor layer 44₁ is a silicon layer and that the sacrificial layer 53 is a silicon dioxide (SiO₂) layer. The temperature process in the hydrogen atmosphere then causes silicon atoms from the semiconductor layer 44₁ to accumulate at the sacrificial layer 53 close to the surface 44₃ of the semiconductor layer 44₁. The accumulated silicon atoms react with the silicon dioxide molecules so that volatile silicon oxide (SiO) is formed, i.e.

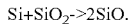

$$Si+SiO_2 \rightarrow 2SiO.$$

According to one example, the duration of the temperature process is selected such that the notch 56 produced in the sacrificial layer 53 extends to the protection layer 52.

Figure 10E:
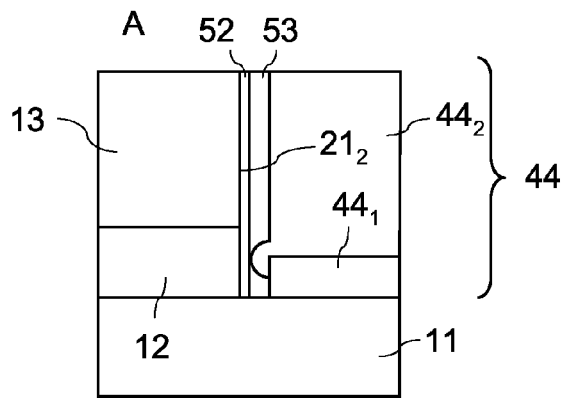

Referring to FIG. 10E, the semiconductor plug 44 is formed in next method steps. The semiconductor layer 44₁ can form a first section of the semiconductor plug 44. In this case, a second section 44₂ of the semiconductor plug 44 is formed on the first section 44₁ by, for example, a selective epitaxial growth process. According to another example, the semiconductor layer 44₁ is removed after the notch 56 in the sacrificial layer 53 has been formed, and the semiconductor plug 44 is formed by epitaxially growing the semiconductor material on the bottom 21₁ of the trench 21.

When the semiconductor plug 44 is formed, the notch 56 in the sacrificial layer 53 is also filled with a semiconductor material. This semiconductor material filling the notch 56 forms a "nose" of the semiconductor plug 44. When the notch 56 is produced to extend to the protection layer 52, this nose of the semiconductor plug 44 in a lateral direction extends to the protection layer 52.

Figure 10F:
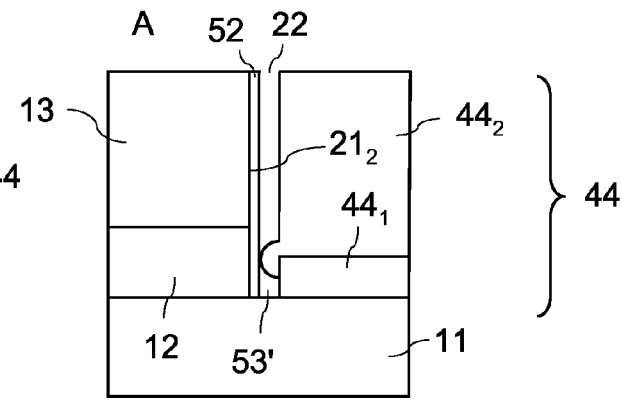

Referring to FIG. 10F, the second trench 22 is formed in next method steps by removing the sacrificial layer 53. The nose of the semiconductor plug 44, however, prevents the second trench 22 from being etched down to the first semiconductor layer 11, so that a section 53' of the sacrificial layer 53 remains between the nose of the semiconductor plug 44 and the first semiconductor layer 11.

Figure 10G:
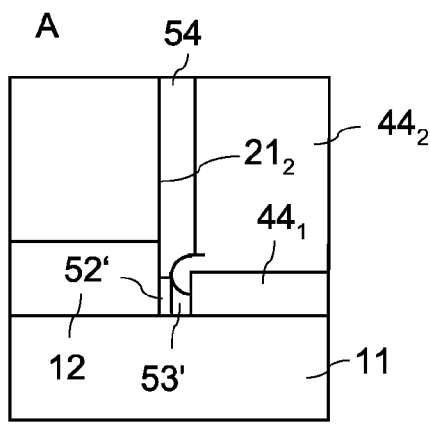

Referring to FIG. 10G, the second dielectric layer 54 is formed by employing the oxidation process. At the end of this process a section 52' of the protection layer may remain between the nose of the plug 54 and the first semiconductor layer 11.

In the method explained with reference to FIGS. 10A to 10G, the protection layer 51 may extend from the bottom 21₁ of trench 21 to the first surface 101. However, as explained with reference to FIGS. 7A to 7E, it is also possible to produce the protection layer 51 such that it essentially only covers the first dielectric layer 12 on the sidewall 21₂ before the method steps illustrated in FIGS. 10A to 10G are carried out.

Referring to FIGS. 11A to 11E, the method explained with reference to FIGS. 5 to 7 can also be modified so that the second dielectric layer 54 is not only produced along the sidewall 21₂ of the first trench, but also partially covers the bottom 21₁.

Figure 11A:
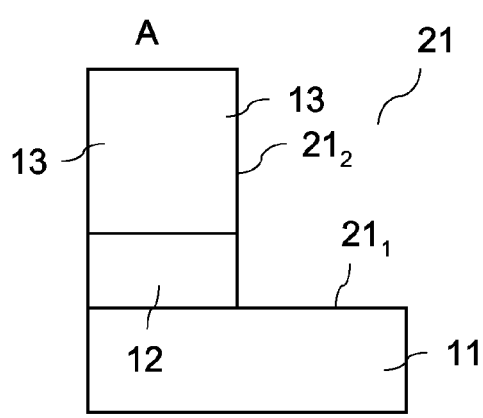
FIGS. 11A to 11E illustrates a fifth modification of the methods of FIGS. 4 and 5.
Figure 11B:
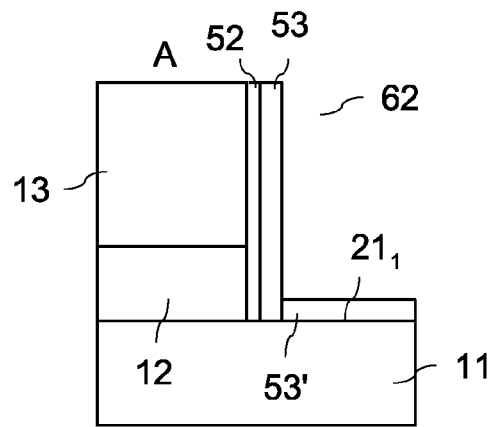

In the method of FIGS. 11A to 11E the sacrificial layer 53 is formed by a oxidation process that oxidizes the protection and sacrificial layer 50 (not shown in FIGS. 11A to 11C) formed on the sidewall 21₂. The oxidation process also forms an oxide layer 53' on the bottom 21₁, as illustrated in FIG. 11B.

spacer 62 is formed on the protection and sacrificial layer 50 along the sidewall 21₂. This spacer 62 protects a part 50₁ of the protection and sacrificial layer on the bottom 21₁ during the method steps that remove the protection and sacrificial layer from the bottom 21₁. Removing the protection and sacrificial layer 50 from the bottom 21₁ has been explained with reference to FIGS. 6B and 6C above.

Figure 11C:
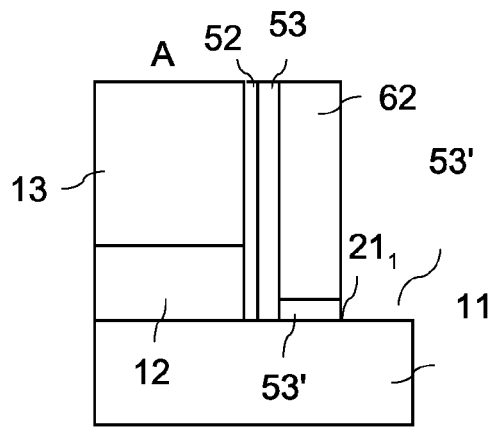

In further method steps, the result of which is illustrated in FIG. 11C, a spacer 62 is formed on the protection and sacrificial layer 50 along the sidewall 21₂. This spacer 62 protects a part of the oxide layer 53' on the bottom 21₁. The spacer 62 is used to etch the oxide layer on the bottom 21₁, so that the part of the oxide layer 53' protected by he spacer remains after the etching process.

Figure 11D:
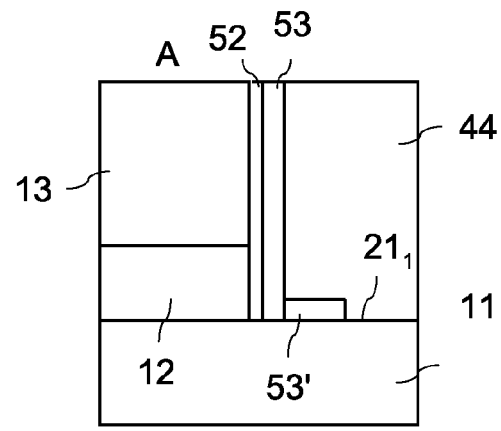
Figure 11E:
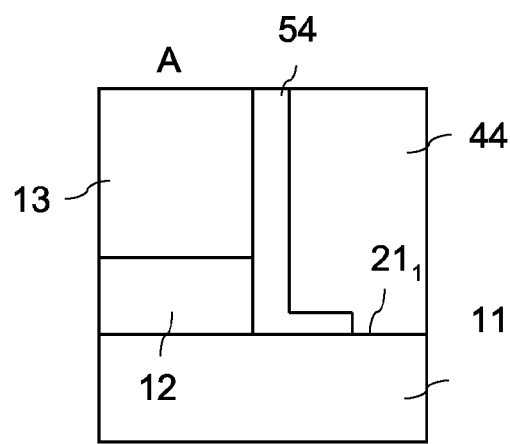

In next method steps which are illustrated in FIGS. 11D and 11E, the semiconductor plug 44 (see FIG. 11D), and the second dielectric layer 54 are formed. By virtue of an L-shape of the structure with the sacrificial layer 53 and the remaining oxide layer 53' on the bottom 21₁, the second dielectric layer 54 also has an L-shape in this example. In the method according to FIGS. 11A to 11D, the protection and sacrificial layer may be an amorphous, a polycrystalline, or a monocrystalline layer.

Alternatively, in the method of FIGS. 11A to 11C, the protection and sacrificial layer 50 is formed on the bottom 21₁ and on the sidewalls 21₂ and an oxidation step for forming the sacrificial layer 53 is formed without removing the protection and sacrificial layer 50 from the bottom. In this case, the protection layer 52 and the sacrificial layer 53 are formed on the bottom 21₁ and on the sidewall, where the sacrificial layer 53 is removed from the bottom 21₂ using the spacer 62, while the protection layer 52 remains on the bottom 21₁. The remaining sacrificial layer 53 has an L-shape in this case, resulting in an L-shaped second dielectric layer 54. In this embodiment (that is not illustrated) the sacrificial and protection layer 50 and, therefore, the protection layer 52, that remains on the bottom 21₂, is, in particular, a monocrystalline layer.

In the methods explained with reference to FIGS. 5 to 11 before, one sacrificial layer 53 is formed before the second semiconductor plug 44 is formed, and the sacrificial layer 53 is removed after the semiconductor plug 44 has been formed. FIGS. 12A to 12E illustrate a method, in which the sacrificial layer is formed in two steps.

Figure 12A:
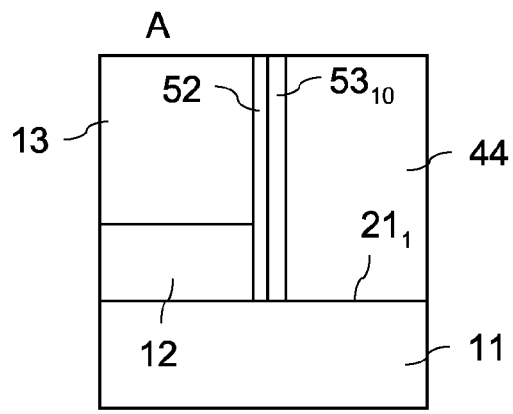
FIGS. 12A to 12E illustrates a further modification of the methods of FIGS. 4 and 5.
Figure 12B:
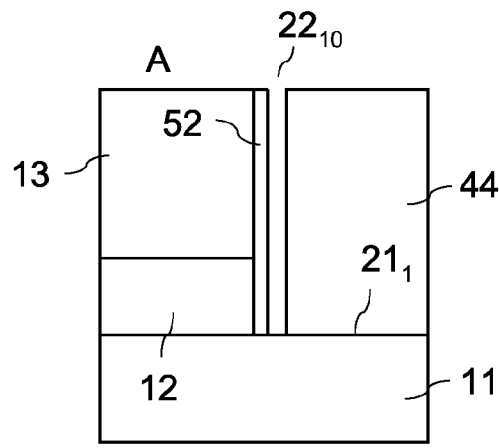

Referring to FIG. 12A a first sacrificial layer 53₁₀ is formed before the semiconductor plug 44 is formed. Forming the first sacrificial layer 53₁₀ may correspond to forming the sacrificial layer 53 as explained with reference to FIGS. 5 to 7. Referring to FIG. 12B, the first sacrificial layer 53₁₀ is removed after the semiconductor plug 44 has been formed. Removing the first sacrificial layer 53₁₀ results in a trench 22₁₀.

Figure 12C:
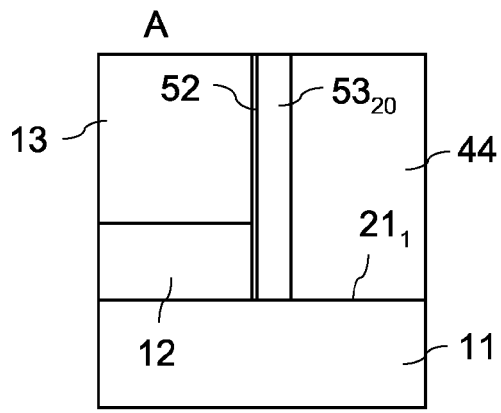

Referring to FIG. 12C a second sacrificial layer 53₂₀ is formed in this trench 22₁₀. Forming the second sacrificial layer 23₂₀ may include an oxidation process that oxidizes a surface of the semiconductor plug 44 and that further oxidizes the protection layer 52. However, the protection layer 52 is not completely oxidized at this step. In the method illustrated in FIG. 12C, the second sacrificial layer 53₂₀ completely fills the trench 22₁₀. However, this is only an example. According to a further embodiment, the second sacrificial layer $53_{20}$ only covers sidewalls of the trench $22_{10}$.

Figure 12D:
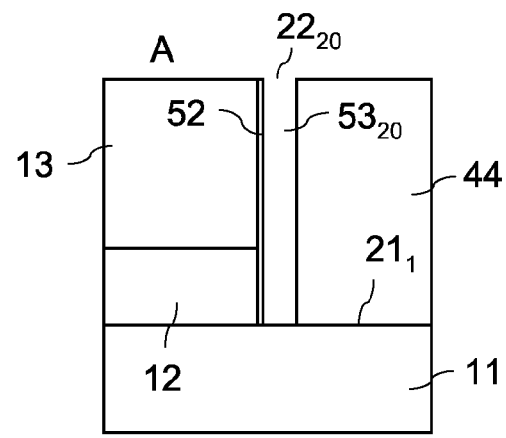
Figure 12E:
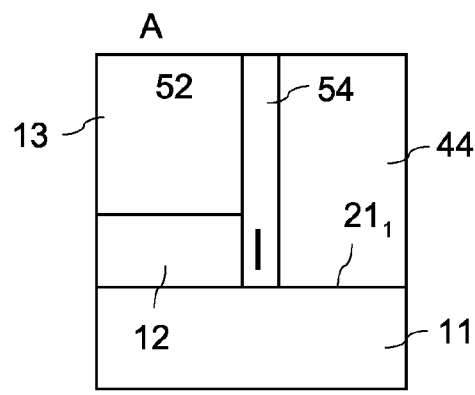

Referring to FIG. 12D the second sacrificial layer $53_{20}$ is removed, so as to form the final second trench $22_{20}$ in which the second dielectric layer 54 is formed, as illustrated in FIG. 12E.

The method steps for removing the first sacrificial layer $53_{20}$ and for removing the second sacrificial layer $53_{20}$ may correspond to the method steps for removing the sacrificial layer 53 explained with reference to FIGS. 5 to 7.

In the method according to FIGS. 12A to 12G, instead of one sacrificial layer, two sacrificial layers are formed, namely a first sacrificial layer $53_{10}$ before forming the semiconductor plug 44, and a second sacrificial layer $53_{20}$ after forming the semiconductor plug 44. In this method, forming the second sacrificial layer $53_{20}$ is part of forming the second trench, in which the second dielectric layer 54 is formed, and serves to widen the second trench in order to produce a thicker second dielectric layer. Thus, in the method of FIG. 12A to 12G, forming the second trench $22_{20}$, in which the second dielectric layer 54 is formed, does not only include removing the first sacrificial layer $53_{10}$, but includes removing the first sacrificial layer $53_{10}$, performing a further oxidation step, so as to form the second sacrificial layer $53_{20}$, and to remove this further sacrificial layer $53_{20}$.

FIGS. 13A to 13F illustrate a further embodiment of a method for producing a semiconductor device with a vertical dielectric layer. FIGS. 13A to 13F illustrate vertical cross sectional views of a semiconductor body 100 during (or after) individual method steps of the method.

Figure 13A:
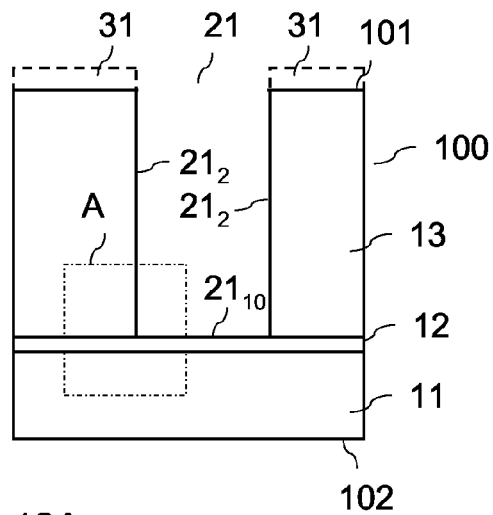
FIGS. 13A to 13F illustrates a further method for producing a dielectric layer in a semiconductor body.

Referring to FIG. 13A, the method includes providing a semiconductor body 100 with a first semiconductor layer 11, a second semiconductor layer 13 and a first dielectric layer 12 arranged between the first semiconductor layer 11 and the second semiconductor layer 13. The semiconductor body 100 further includes a first trench 21 extending from a first surface 101 of the semiconductor body 100 through the second semiconductor layer 13 to or into first dielectric layer 12. The first trench 21 has a bottom $21_{10}$ formed by the first dielectric layer 12 and has at least one sidewall $21_2$ formed by the second semiconductor layer 13. The geometry of the first trench 21 may correspond to the geometry of the first trench 21 explained herein before.

The first trench 21 may be obtained by etching the second semiconductor layer 13 down to the first dielectric layer 12 using an etch mask 31 (illustrated in dashed lines in FIG. 1). The etch mask is, for example, a hard mask, in particular an oxide hard mask. The etching process that etches the second semiconductor layer 13 is, e.g., an anisotropic etching process.

Figure 13B:
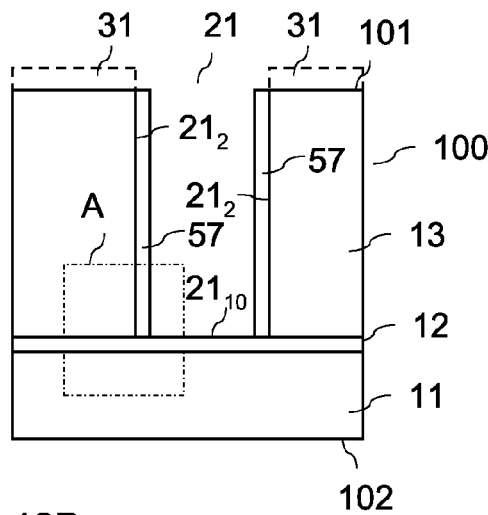

Referring to FIG. 13B a sacrificial layer 57 is formed on the sidewall $21_2$ of the first trench 21. Producing the sacrificial layer 57 may include producing a sacrificial layer on the sidewall $21_2$ and the bottom $21_{10}$ of the first trench 21, and removing the sacrificial layer from the bottom $21_{10}$ using, e.g., an anisotropic etching process. Layer 57 is referred to as sacrificial layer because this layer is at least partly removed in further process steps explained below.

Figure 13C:
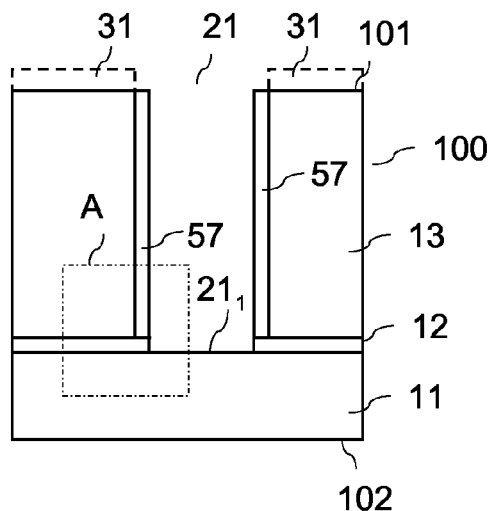

Referring to FIG. 13C, the first dielectric layer 12 is removed at the bottom $21_{10}$ of the first trench 21, so as to extend the first trench 21 through the first dielectric layer 12 to or into the first semiconductor layer 11. Removing the first dielectric layer 12 at the bottom $21_{10}$ of the first trench 21 may include an etching process that etches the first dielectric layer 12 selectively relative to the sacrificial layer 57, so that the sacrificial layer 57 remains on the sidewall $21_2$. In FIG. 13C reference character $21_1$ denotes the bottom of the extended first trench, with the bottom $21_1$ being formed by the first semiconductor layer 11.

Figure 13D:
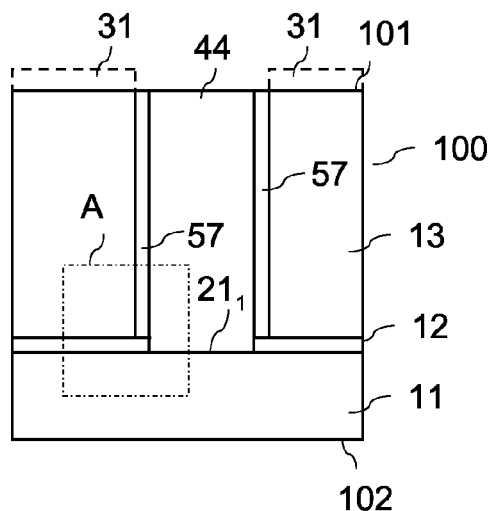

Referring to FIG. 13D, a semiconductor plug 44 is grown on the bottom $21_1$ of the first trench 21. Growing the semiconductor plug 44 may include one of the methods explained herein before.

Figure 13E:
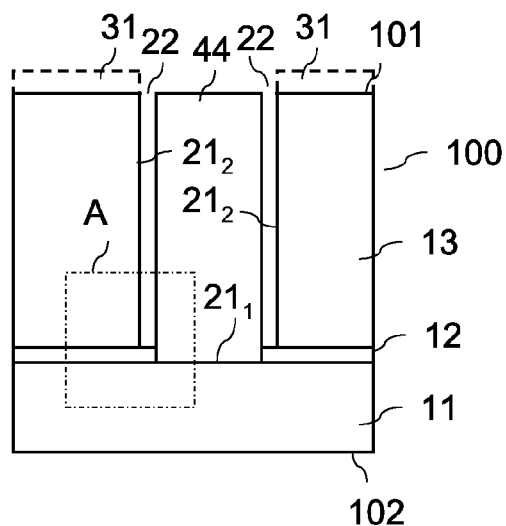
Figure 13F:
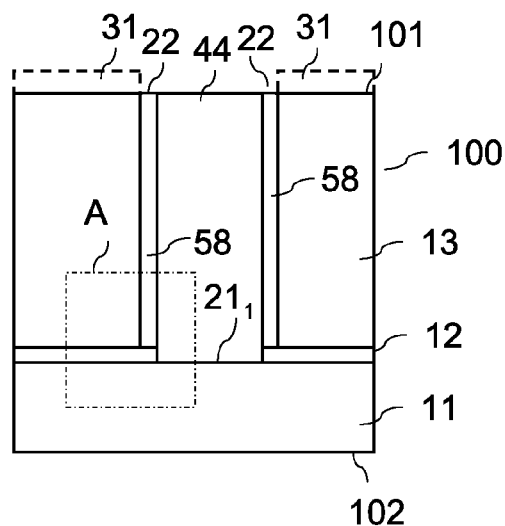

Referring to FIGS. 13E and 13F, a second trench 22 is formed between the sidewall $21_2$ and the semiconductor plug 44 (FIG. 13E) and a vertical dielectric layer 58 is formed in the second trench 22 (FIG. 13F).

The sacrificial layer includes a material that is different from the material of the first dielectric layer 12, so that that the sacrificial layer 57 can be removed selectively relative to the first dielectric layer. According to one embodiment, the sacrificial layer 57 is a carbon layer. The first dielectric layer 12 may be an oxide layer in this embodiment. In this case, forming the second trench 22 may include a high temperature process that ashes the carbon layer. This high temperature process may result in oxide layers along sidewalls of the second trench 22 on the second semiconductor layer 13 and the semiconductor plug 44. In this embodiment, the vertical dielectric layer 58 is, for example, a thermal oxide layer produced by (further) thermally oxidizing the semiconductor material of the second semiconductor layer 13 and of the semiconductor plug 44 along the sidewalls of the second trench 22 until the vertical dielectric layer 58 completely fills the second trench 22.

FIGS. 14A to 14H illustrate a modification of the method of FIGS. 13A to 13F. In FIGS. 14A to 14H vertical cross sectional views of the semiconductor body 100 in the detail region A are illustrated.

Figure 14A:
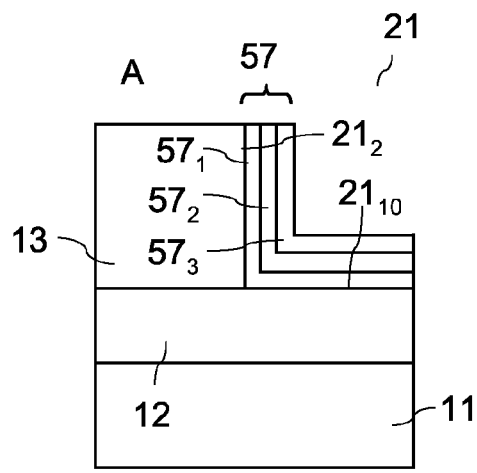
FIGS. 14A to 14H illustrates a modification of the method of FIGS. 13A to 13F.
Figure 14B:
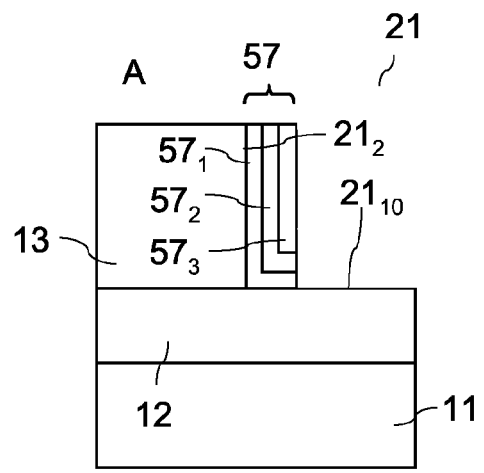

Referring to FIGS. 14A and 14B, the sacrificial layer 57 includes a layer stack with three layers $57_1$, $57_2$, $57_3$. Forming this sacrificial layer 57 includes forming a first layer $57_1$ on the sidewall $21_2$ and the bottom $21_{10}$, forming a second layer $57_2$ on the first sacrificial layer $57_1$, and forming a third layer $57_3$ on the second layer $57_2$, and removing the first, second and third layers $57_1$, $57_2$, $57_3$ above the bottom $21_{10}$ of the first trench 21. Thus, a layer stack with the first, second and third layers $57_1$-$57_3$ remains on the sidewall $21_2$, with a section of the first layer $57_1$ separating the second layer $57_2$ from the first dielectric layer 12. The first layer $57_1$ is basically L-shaped, with a first section (vertical section) on the sidewall $21_2$ of the trench 22, and with a second section (horizontal section) on the first dielectric layer 12 on the bottom $21_{10}$ of the trench 22. The horizontal section of the "L" separates the first dielectric layer 12 and the second sacrificial layer $50_2$. The third layer $57_3$ is optional and may be omitted. According to one embodiment, the first layer $57_1$ is a carbon layer, the second layer $57_2$ is an oxide layer, such as a deposited oxide layer (TEOS), and the third layer $57_3$ is a nitride layer.

Figure 14C:
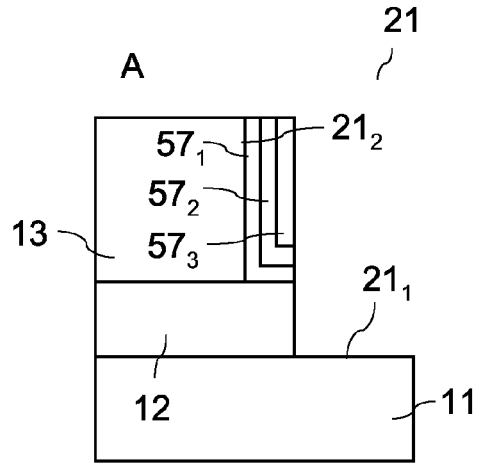

Referring to FIG. 14C, the first trench 21 is further etched through the first dielectric layer 12 to or into the first semiconductor layer 11, so that the first semiconductor layer 11 forms a bottom $21_1$ of the first trench 21. The etching process is, e.g. an anisotropic etching process that leaves the layer stack with the first, second and third sacrificial layer $57_1$-$57_3$ on the sidewall $21_2$. In this process, the third layer $57_3$ acts as a protection layer that protects the first and second layers $57_1$, $57_2$ during the etching process. The third layer $57_3$ is, e.g., a nitride layer or a carbon layer.

Figure 14D:
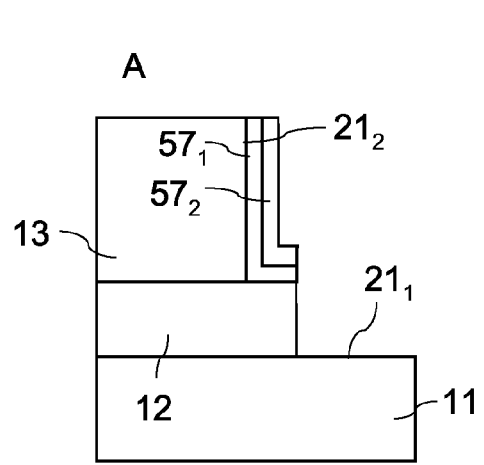
Figure 14E:
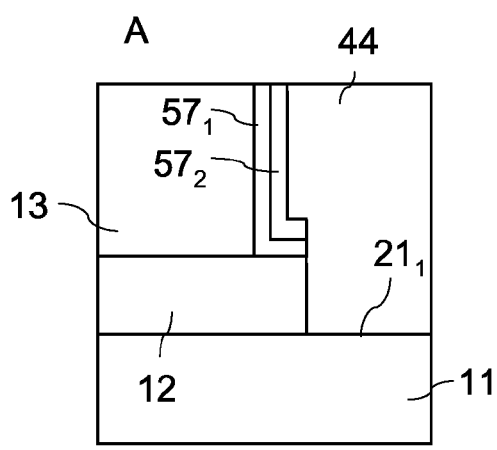

Referring to FIGS. 14D and 14E, the third layer $57_3$ is removed, while the first and second layers $57_1$, $57_2$ remain, and the semiconductor plug 44 is grown on the bottom $21_1$ of the first trench 21 until the semiconductor plug 44 completely fills the first trench 21. Any of the methods explained before for growing the semiconductor plug may be employed.

Figure 14F:
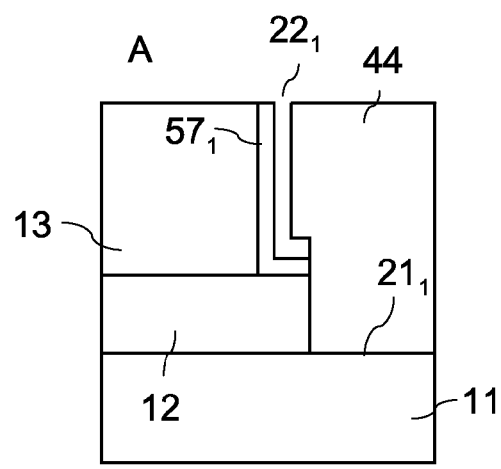

Referring to FIG. 14F, the second layer 57$_2$ is removed. Removing the second layer 57$_2$ may include an etching process that etches the material of the second layer 57$_2$ selectively relative to the semiconductor material of the semiconductor plug 44 and relative to the material of the first sacrificial layer 57$_1$. The first dielectric layer 12 and the second layer 57$_2$ may include the same dielectric material, such as, e.g. an oxide. In the process of removing the second layer 57$_2$, the horizontal section of the L-shaped layer 57$_1$ protects the first dielectric layer 12 from being etched. In this embodiment, the first layer 57$_1$ acts as a protection layer that protects the first dielectric layer 12 in the process of removing the second sacrificial layer 57$_2$.

Figure 14G:
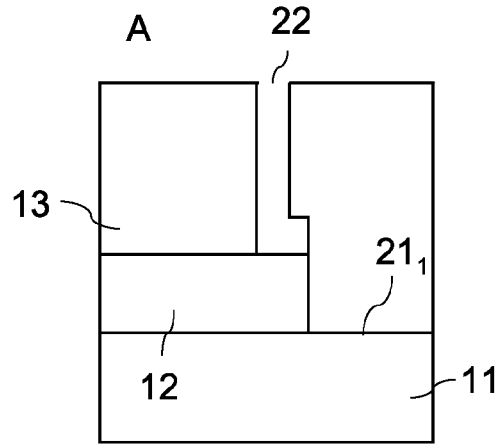

A first section 22$_1$ of the second trench 22 is formed by removing the second layer 57$_2$. Referring to FIG. 14G, removing the first layer 57$_1$ completes forming the second trench 22.

Figure 14H:
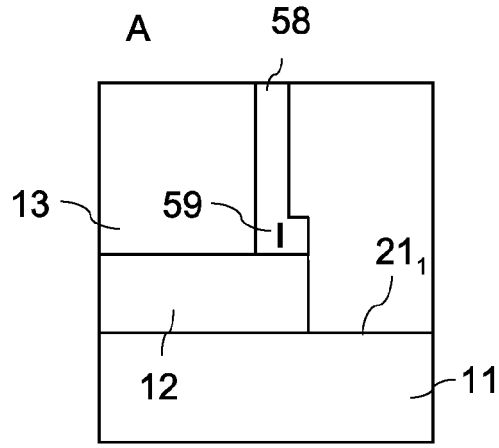

Referring to FIG. 14H, the second trench 22 is finally filled with the vertical dielectric layer 58. Forming the vertical dielectric layer 58 may, for example, include a thermal oxidation process. The vertical dielectric layer 58 may include a void 59 close to this first dielectric layer 12. However, this void 59 does not negatively affect operation of the semiconductor device.

Figure 15A:
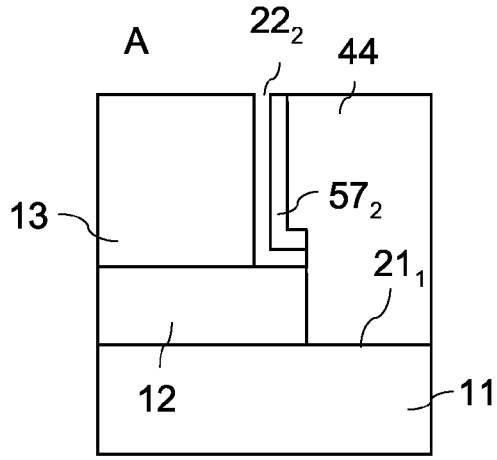
FIGS. 15A and 15B illustrates a modification of the method of FIGS. 14A to 14H.

Alternatively to removing the second layer 57$_2$ after forming semiconductor the semiconductor plug 44, as illustrated in FIG. 14F, the second sacrificial layer 57$_2$ may remain in those cases in which the second sacrificial layer is a dielectric layer, such as an oxide layer. Referring to FIG. 15A, in this alternative process only the first layer 57$_1$ is removed. The first sacrificial layer 57$_1$ is, e.g., a carbon layer. Such carbon layer can be removed with a selectivity against the semiconductor layer 13 and the second layer 57$_2$ using, e.g., a high temperature process that ashes the carbon layer. Removing the first sacrificial layer 57$_1$ results in a trench 22$_2$.

Figure 15B:
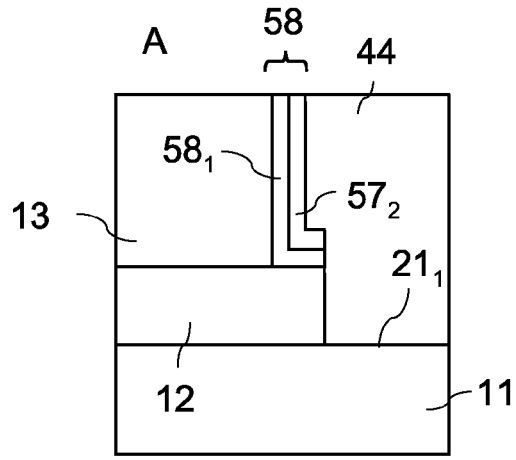

Referring to FIG. 15B, the trench 22$_2$ is filled with a vertical dielectric layer 58$_1$. This dielectric layer 58$_1$ is, e.g., an oxide layer that is formed through a thermal oxidation process. In this embodiment, the vertical dielectric layer 58 between the semiconductor layer 13 and the semiconductor plug 44 includes the second layer 57$_2$ of the layer stack and the dielectric layer 58$_1$.

Figure 16A:
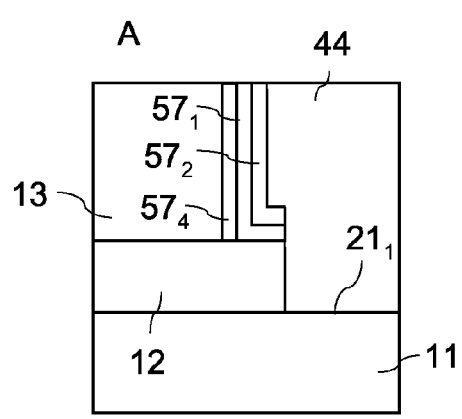
FIGS. 16A to 16C illustrates a further modification of the method of FIGS. 14A to 14H.
Figure 16B:
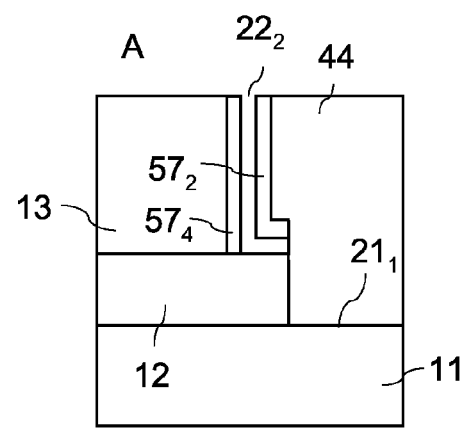
Figure 16C:
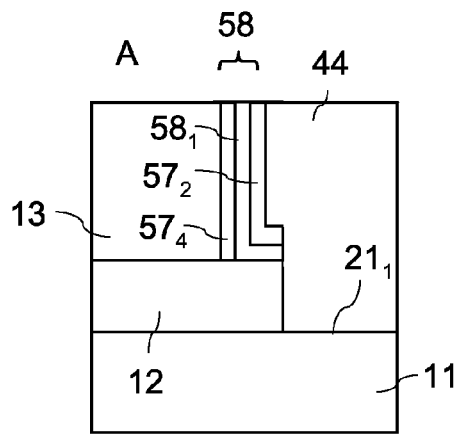

FIGS. 16A to 16C illustrate a further modification of the method of FIGS. 14A to 14H. In the method of FIGS. 16A to 16C, a further layer 57$_4$ of the layer stack is formed on the semiconductor layer 13 before the first layer 57$_1$ is formed. The further layer 57$_4$ is, e.g., an oxide layer formed through a thermal oxidation process. FIG. 16A shows the layer stack with the further layer 57$_4$ on the semiconductor layer 13, the first layer 57$_1$ on the further layer 57$_4$, and the second layer on the first layer 57$_1$ after forming the semiconductor plug 44 (and removing the optional third layer 57$_3$).

Referring to FIG. 16B, the first layer 57$_1$ is removed so as to form a trench 22$_2$, while the second layer 57$_2$ and the further layer 57$_4$ remain. According to one embodiment, the second layer 57$_2$ and the further layer 57$_4$ are oxide layers and the first layer 57$_1$ is a carbon layer. The carbon layer 57$_1$ can be removed selectively relative to the oxide layers 57$_2$, 57$_4$ using conventional process steps.

Referring to FIG. 16C, the trench 22$_2$ is filled with a vertical dielectric layer 58$_1$. This dielectric layer 58$_1$ is, e.g., an oxide layer that is formed through a thermal oxidation process. In this embodiment, the vertical dielectric layer 58 between the semiconductor layer 13 and the semiconductor plug 44 includes the second layer 57$_2$ and the further layer 57$_4$ of the layer stack and the dielectric layer 58$_1$.

Figure 17:
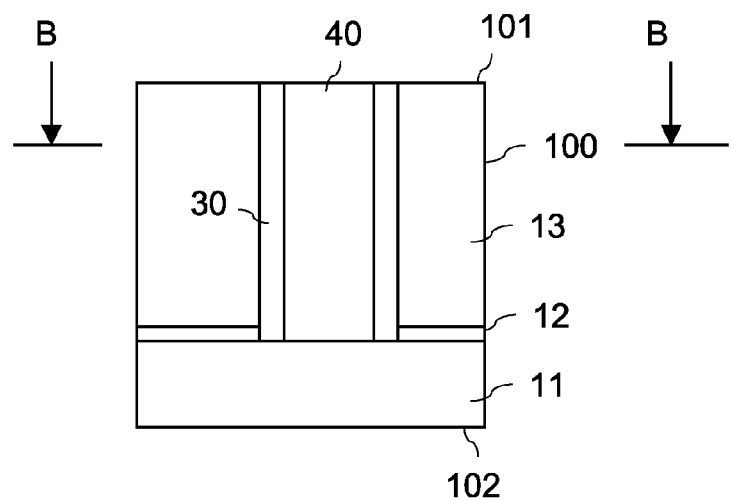
FIG. 17 illustrates a vertical cross sectional view of a semiconductor body with a horizontal and a vertical dielectric layer.

With the methods explained before, a semiconductor body 100 can be formed that, referring to FIG. 17, essentially includes a first semiconductor layer 100, a semiconductor plug 40 adjoining the first semiconductor layer 100 and dielectrically insulated in a lateral direction from a second semiconductor layer 13 by a dielectric layer 30. A first dielectric/insulating layer 12 is arranged between the first and second semiconductor layer 11, 13. In FIG. 17, semiconductor plug 40 represents one of semiconductor plugs 41, 42 and 44 respectively, explained before. The dielectric layer 30 in FIG. 17 represents one of the vertical dielectric structures extending from the first surface 101 to the first semiconductor layer 11 explained before. According to one example, a plurality of semiconductor plugs 40 is produced in the semiconductor body 100.

Figure 18:
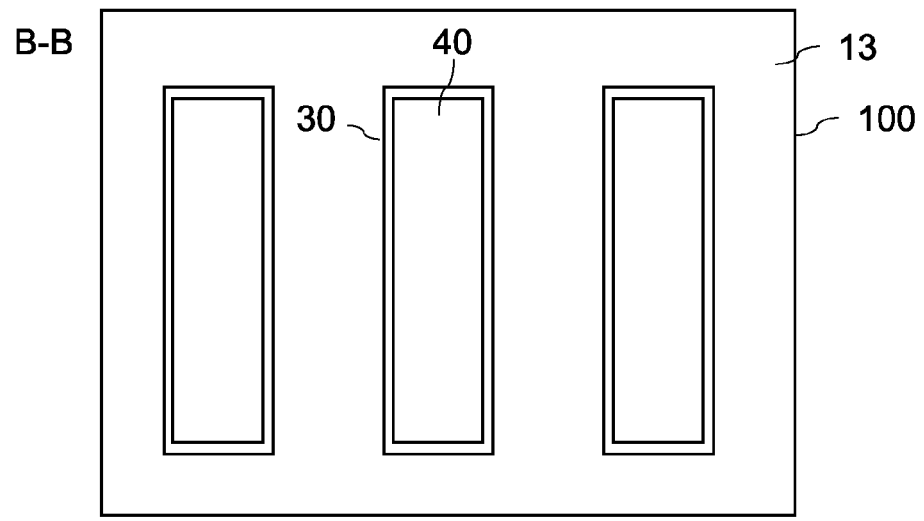
FIG. 18 illustrates a horizontal cross sectional view of the semiconductor body of FIG. 12, according to a first example.

Referring to FIG. 18, which illustrates a horizontal cross sectional view of the structure illustrated in FIG. 13 in a horizontal section plane B-B, the semiconductor plugs 40 can be produced to be completely surrounded by dielectric layers 30 in the horizontal direction, so that the second semiconductor layer 13 surrounds the plugs 40.

Figure 19:
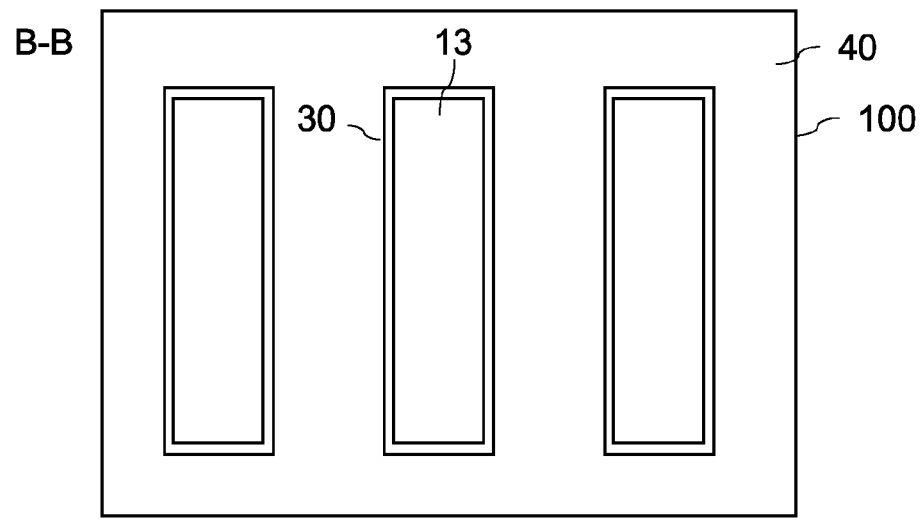
FIG. 19 illustrates a horizontal cross sectional view of the semiconductor body of FIG. 12, according to a second example.

Referring to FIG. 19, which illustrates a further example, the dielectric layer 30 can be produced to completely surround sections of the second semiconductor layer 13, so that the plug surrounds these sections of the second semiconductor layer. A structure as illustrated in FIG. 14 can be obtained by producing the first trench 21 with a rectangular, circular or polygonal shape. The structure of FIG. 19 can be obtained when producing the first trench 21 with a grid-shape.

Based on the structures illustrated in FIGS. 17 and 18 a MOSFET can be implemented. A vertical cross sectional view of an example of this MOSFET is illustrated in FIG. 19. In this MOSFET, the first semiconductor layer 11 forms a drain region 71 of the MOSFET. The drain region 71 is electrically connected to a drain terminal D that is only schematically illustrated in FIG. 19. In an n-type MOSFET, the drain region 71 is n-doped in a p-type MOSFET the drain region 71 is p-doped. The doping concentration of the drain region 71 corresponds to the doping concentration of the semiconductor layer 11 which is, for example, in the range of between $5*10^{17}$ cm$^{-3}$ and $10^{21}$ cm$^{-3}$.

The MOSFET further includes a drift region 72, a source region 73 and a body region 74 arranged between the source region 73 and the drift region 72. The drift region 72, the source region 73 and the body region 74 are formed in the semiconductor plug 40. The MOSFET further includes a gate electrode 75 which extends from the source region 73 through the body region 74 to the drift region 72 and which is dielectrically insulated from these semiconductor regions 72, 73, 74 by a gate dielectric 76. In the example illustrated in FIG. 19, the gate electrode 75 is a trench electrode that is arranged in a trench in the semiconductor plug 40. However, this is only an example. The gate electrode 75 could also be implemented as a planar electrode above the surface 101 of the semiconductor body 100. According to one example, the doping concentration of the drift region 72 corresponds to the basic doping concentration of the semiconductor plug 40. The doping concentration of the semiconductor plug 40 is adjusted during the epitaxial growth process, in which the semiconductor plug 40 is formed. The doping concentration of the drift region 72 is, for example, in the range of between $10^{12}$ cm$^{-3}$ and $10^{15}$ cm$^{-3}$.

The body region 74 and the source region 73 can be produced in a conventional manner by implantation and/or diffusion processes. The gate electrode 75 and the gate dielectric 76 can also be produced in a conventional manner by etching processes, gate dielectric forming processes and gate electrode forming processes. In an n-type MOSFET, the source region 73 is n-doped, while in a p-type MOSFET, the source region 73 is p-doped. The doping concentration of the source region 73 can be in the same range as the doping concentration of the drain region 71.

The MOSFET can be implemented as an enhancement MOSFET or as a depletion MOSFET. In an enhancement MOSFET, the body region 74 is doped complementarily to the source region 73. In a depletion MOSFET, the body region 74 at least along the gate dielectric 76 includes a semiconductor region of the same doping type as the source region 73.

In the type of MOSFET illustrated in FIG. 19, the drift region 72 can have the same doping type as the drain region 71 and the source region 73, but could also be doped complementarily to the source region 73 and the drain region 71, wherein at least a section of the drift region 72 between the vertical dielectric structure 30 and the channel region of the MOSFET may have the same doping type as the source region 73. The "channel region" of the MOSFET is the region of the body region 74 along the gate dielectric 76.

Referring to FIG. 19, the gate electrode 75 is electrically connected to a gate terminal G (only schematically illustrated in FIG. 19) and the source and body regions 73, 74 are electrically connected to a source terminal S.

Referring to FIG. 19, the MOSFET further includes a drift control region 81 that is dielectrically insulated from the drift region 72 by the vertical dielectric structure 30. In this MOSFET, the vertical dielectric structure 30 acts as a drift control region dielectric. The drift control region 81 generates a conducting channel in the drift region 72 along the drift control region dielectric 30 when the MOSFET is in its on-state, so as to reduce the on-resistance of the MOSFET. The MOSFET, like a conventional MOSFET, is in its on-state, when an electrical potential is applied to the gate terminal G that causes a conducting channel in the body region 74 between the source region 73 and the drift region 72 along the gate dielectric 76, and when an electrical voltage is applied between the drain and the source terminals D, S. The conducting channel along the gate control region dielectric 30 is an accumulation channel when the drift region 72 has the same doping type as the source drain regions 73, 71, and is an inversion channel, when the drift region 72 is doped complementary.

The MOSFET further includes a biasing source 91 coupled to the drift control region 81. According to one embodiment (not illustrated) the biasing source 91 is implemented as a rectifier element, such as a diode, connected between the gate terminal G and the drift control region 81. Optionally, a capacitive storage element 93, such as a capacitor, is coupled between the drift control region 81 and a terminal for a reference potential, such as the source terminal S. Further, a rectifier element 92, such as a diode, is connected between the drain region 71 and the drift control region 81. Optionally, the rectifier element 92 is connected to a connection region 82 which has the same doping type as the drift control region 81, but a higher doping concentration. The connection region 82 may adjoin the first dielectric layer and is already present in the semiconductor body that forms the basis for the method explained before.

Figure 20:
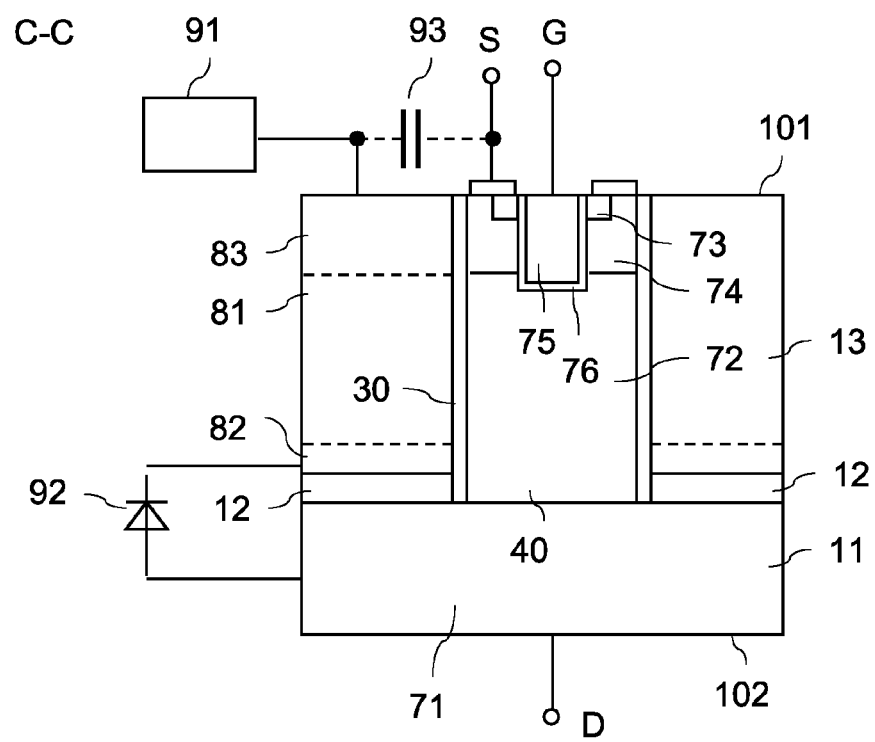
FIG. 20 illustrates a first vertical cross sectional view of a MOSFET with a vertical dielectric layer.

Referring to FIG. 20, which illustrates a vertical cross sectional view of the drift control region 81 the rectifier element 92 can be connected to the drift control region 81 via the first surface 101. According to one example, a further connection zone 84 of the same doping type as the connection zone 82 extends from the first surface 101 in a vertical direction to the connection zone 82. In the embodiment illustrated in FIG. 20, the drift control region 81 has an elongated (stripe-shaped geometry), where the rectifier element 92 is connected to the drift control region 81 at a longitudinal end. The vertical cross sectional view illustrated in FIG. 19 can be a cross sectional view in a section plane C-C illustrated in FIG. 20.

Figure 21:
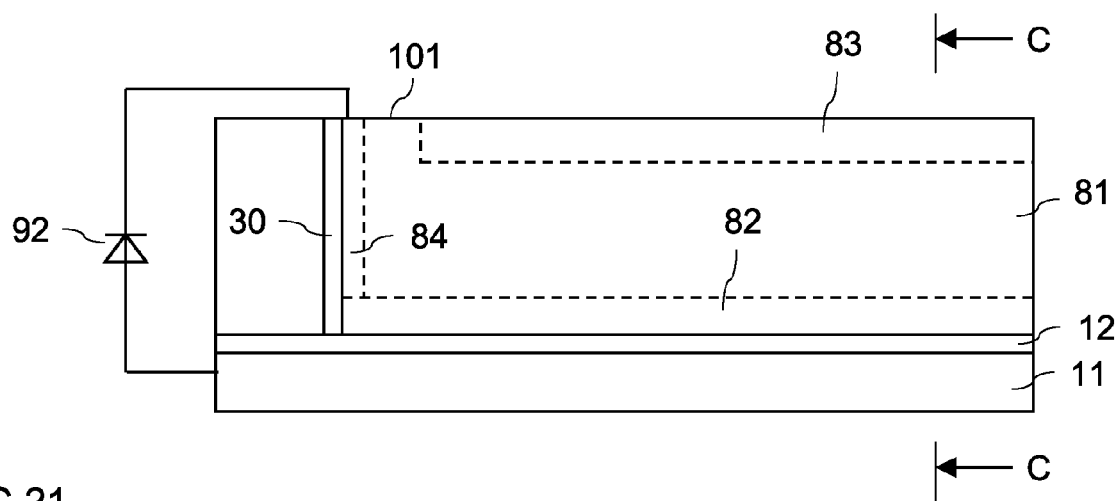
FIG. 21 illustrates a second vertical cross sectional view of a MOSFET with a vertical dielectric layer.

Referring to FIG. 21, the MOSFET may further include a semiconductor zone 83 doped complementarily to the drift control region 81. In this case, the biasing source 91 and the optional capacitive storage element 93 are connected to this semiconductor region 83.

The operating principle of the MOSFET 21 will now briefly be explained. For explanation purposes it is assumed that the MOSFET is an n-type MOSFET with an n-doped drift zone 72, that the drift control region 81 has the same doping type as the drift region 72. The biasing source 91 is configured to bias the drift control region 81 to a positive potential relative to the electrical potential of the source terminal S, when the MOSFET is in its on-state. The MOSFET is in its on-state, when the drive potential applied to the gate terminal G generates a conducting channel in the body region 74 between the source region 73 and the drift region 72, and when a positive voltage is applied between the drain and the source terminals D, S. In the on-state, the drift control region 81, which has a higher electrical potential than the drift region 72, generates an accumulation channel along the gate control region dielectric 30 in the drift region 72. This accumulation channel significantly reduces the on-resistance as compared to a MOSFET without drift control region 81. The MOSFET is in the off-state, when the channel in the body region 74 is interrupted. In this case, a depletion region expands in the drift region 72 beginning at the pn-junction between the body region 74 and the drift region 72. The depletion region 72 expanding in the drift region 72 causes a depletion region also to expand in the drift control region 81. By virtue of a depletion region expanding in the drift region 72 and a depletion region expanding in the drift control region 81, a voltage across the drift control region dielectric 30 is limited. The capacitive storage element 93 serves to store electrical charges that are required in the drift control region 81 when the MOSFET is in its on-state. The rectifier element 92 allows charge carriers that are thermally generated in the drift control region 81 to flow to the drift region 71.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

In addition, spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor device with a dielectric layer, the method comprising:
   providing a semiconductor body with a first trench extending into the semiconductor body, the first trench having a bottom and a sidewall;
   forming a first dielectric layer on the sidewall in a lower portion of the first trench;
   forming a first plug in the lower portion of the first trench so as to cover the first dielectric layer, the first plug leaving an upper portion of the sidewall uncovered;
   forming a sacrificial layer on the sidewall in the upper portion of the first trench;
   forming a second plug in the upper portion of the first trench;
   removing the sacrificial layer, so as to form a second trench having sidewalls and a bottom;
   forming a second dielectric layer in the second trench and extending to the first dielectric layer; and
   forming a source region and a body region in the second plug.

2. The method of claim 1, wherein forming the second dielectric layer comprises:
   removing the first plug below the bottom of the second trench down to the second dielectric layer, so as to form a third trench; and
   forming a third dielectric layer in the third trench, the third dielectric layer adjoining the second dielectric layer.

3. The method of claim 1, wherein forming the second dielectric layer comprises an oxidation step that oxidizes the sidewalls of the second trench and the plug below the second trench.

4. The method of claim 1, wherein the semiconductor body includes a first semiconductor layer, a second semiconductor layer, a further dielectric layer arranged between the first semiconductor layer and the second semiconductor layer, with the further dielectric layer being uncovered at the sidewall.

5. The method of claim 4, wherein the first dielectric layer covers the further dielectric layer on the sidewall.

6. The method of claim 1, wherein forming the first dielectric layer comprises:
   forming a dielectric layer covering the sidewall; and
   removing the dielectric layer in the upper portion of the first trench.

7. The method of claim 6, wherein removing the dielectric layer in the upper portion of the first trench comprises:
   forming a mask layer on the bottom of the first trench; and
   etching the dielectric layer using the mask layer as a mask.

8. The method of claim 7, wherein the mask layer is a semiconductor layer.

9. The method of claim 8, wherein the semiconductor layer is an epitaxial layer.

10. The method of claim 9, wherein forming the first plug comprises:
    forming the mask layer to be a semiconductor layer; and
    forming a further semiconductor layer on the mask layer.

11. The method of claim 10, wherein the further semiconductor layer is an epitaxial layer.

12. The method of claim 1, wherein forming the first and second plugs comprises epitaxially growing a semiconductor material.

13. The method of claim 1, wherein the sacrificial layer is an oxide layer.

14. The method of claim 1, wherein the second dielectric layer is an oxide layer.

15. A method for producing a semiconductor device with a dielectric layer, the method comprising:
    providing a semiconductor body with a first trench extending into the semiconductor body, the first trench having a bottom and a sidewall;
    forming a first dielectric layer on the sidewall in a lower portion of the first trench;
    forming a first plug in the lower portion of the first trench so as to cover the first dielectric layer, the first plug leaving an upper portion of the sidewall uncovered;
    forming a sacrificial layer on the sidewall in the upper portion of the first trench;
    forming a second plug in the upper portion of the first trench;
    removing the sacrificial layer, so as to form a second trench having sidewalls and a bottom; and
    forming a second dielectric layer in the second trench and extending to the first dielectric layer, wherein forming the second dielectric layer comprises:
      removing the first plug below the bottom of the second trench down to the second dielectric layer, so as to form a third trench; and
      forming a third dielectric layer in the third trench, the third dielectric layer adjoining the second dielectric layer.

16. A method for producing a semiconductor device with a dielectric layer, the method comprising:
    providing a semiconductor body with a first trench extending into the semiconductor body, the first trench having a bottom and a sidewall;
    forming a first dielectric layer on the sidewall in a lower portion of the first trench;
    forming a first plug in the lower portion of the first trench so as to cover the first dielectric layer, the first plug leaving an upper portion of the sidewall uncovered;
    forming a sacrificial layer on the sidewall in the upper portion of the first trench;
    forming a second plug in the upper portion of the first trench;
    removing the sacrificial layer, so as to form a second trench having sidewalls and a bottom;
    forming a second dielectric layer in the second trench and extending to the first dielectric layer,
    wherein forming the first and second plugs comprises epitaxially growing a semiconductor material.

* * * * *